United States Patent
Furesawa et al.

(10) Patent No.: US 12,464,836 B2
(45) Date of Patent: Nov. 4, 2025

(54) SEMICONDUCTOR DEVICE AND METHOD OF MANUFACTURING SEMICONDUCTOR DEVICE

(71) Applicant: CANON KABUSHIKI KAISHA, Tokyo (JP)

(72) Inventors: Ayako Furesawa, Tokyo (JP);
Yoshinori Tateishi, Kanagawa (JP);
Toshio Tomiyoshi, Kanagawa (JP);
Takahiro Hachisu, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 516 days.

(21) Appl. No.: 17/840,926

(22) Filed: Jun. 15, 2022

(65) Prior Publication Data

US 2022/0415960 A1 Dec. 29, 2022

(30) Foreign Application Priority Data

Jun. 25, 2021 (JP) .................................. 2021-105541
Mar. 16, 2022 (JP) .................................. 2022-041120

(51) Int. Cl.
*H10F 39/00* (2025.01)
*H01L 21/78* (2006.01)
(Continued)

(52) U.S. Cl.
CPC .......... *H10F 39/026* (2025.01); *H01L 21/78* (2013.01); *H10F 39/1895* (2025.01);
(Continued)

(58) Field of Classification Search
CPC ... H01L 21/78; H10F 39/026; H10F 39/1895; H10F 39/1935; H10F 39/809; H10F 39/80; H10F 71/136
See application file for complete search history.

(56) References Cited

U.S. PATENT DOCUMENTS 8,664,025 B2 * 3/2014 Richter ................. H01L 23/522
438/113
8,848,075 B2 * 9/2014 Takahashi ............ H10F 39/199
348/294

(Continued)

FOREIGN PATENT DOCUMENTS

JP 2011-096851 A 5/2011
JP 2018-022924 A 2/2018
(Continued)

OTHER PUBLICATIONS

Office Action in Taiwanese Application No. 111121216 (May 2024).

*Primary Examiner* — David A Zarneke
(74) *Attorney, Agent, or Firm* — Venable LLP

(57) ABSTRACT

A disclosed method of manufacturing a semiconductor device includes singulating a bonded substrate including a first substrate provided with an interconnection structure layer and a first bonding layer and a second substrate provided with a second bonding layer opposed to the first bonding layer into a plurality of semiconductor devices. The bonded substrate includes functional element regions and a scribe region in a plan view. The singulating includes forming a groove in the scribe region, and cutting the bonded substrate in a region outside an inner side surface of the groove. The groove is formed penetrating one of the first substrate and the second substrate, the interconnection structure layer, and the first and second bonding layers. The groove extends from the one of the first substrate and the second substrate to a position deeper than all interconnection layers provided between the first and second substrates.

30 Claims, 29 Drawing Sheets

(51) Int. Cl.
*H10F 39/12* (2025.01)
*H10F 39/18* (2025.01)

(52) U.S. Cl.
CPC ......... *H10F 39/1935* (2025.01); *H10F 39/80* (2025.01); *H10F 39/809* (2025.01); *H10F 39/811* (2025.01); *H10F 39/8057* (2025.01); *H10F 39/8063* (2025.01)

(56) References Cited

U.S. PATENT DOCUMENTS

| | | | |
|---|---|---|---|
| 10,319,696 B1* | 6/2019 | Nakano | H01L 24/11 |
| 10,424,548 B2 | 9/2019 | Kazue et al. | |
| 2008/0277765 A1* | 11/2008 | Lane | H01L 21/78 |
| | | | 257/E21.546 |
| 2010/0181681 A1* | 7/2010 | Akiba | H01L 21/78 |
| | | | 257/773 |
| 2010/0273312 A1* | 10/2010 | Noda | B23K 26/40 |
| | | | 257/E21.599 |
| 2011/0057332 A1* | 3/2011 | Iwami | H01L 24/27 |
| | | | 257/E21.599 |
| 2011/0102617 A1* | 5/2011 | Seri | G06T 7/0004 |
| | | | 348/222.1 |
| 2011/0102657 A1 | 5/2011 | Takahashi et al. | |
| 2012/0156823 A1* | 6/2012 | Myung | H01L 25/0657 |
| | | | 257/E31.11 |
| 2013/0344658 A1* | 12/2013 | Sakurada | H01L 21/78 |
| | | | 438/113 |
| 2014/0339667 A1 | 11/2014 | Takahashi et al. | |
| 2016/0042997 A1* | 2/2016 | Takahashi | H01L 21/6835 |
| | | | 438/464 |
| 2016/0071767 A1* | 3/2016 | Hashimoto | H01L 21/30604 |
| | | | 257/620 |
| 2016/0329370 A1 | 11/2016 | Takahashi et al. | |
| 2016/0343764 A1 | 11/2016 | Takahashi et al. | |
| 2017/0213919 A1 | 7/2017 | Takahashi et al. | |
| 2017/0213920 A1 | 7/2017 | Takahashi et al. | |
| 2018/0277493 A1 | 9/2018 | Shima et al. | |
| 2019/0139908 A1 | 5/2019 | Shima et al. | |
| 2019/0221548 A1 | 7/2019 | Huang et al. | |
| 2019/0378871 A1 | 12/2019 | Takahashi et al. | |
| 2020/0365641 A1 | 11/2020 | Takahashi et al. | |
| 2020/0395479 A1 | 12/2020 | Fujioka et al. | |
| 2021/0104629 A1 | 4/2021 | Fujioka et al. | |
| 2023/0014646 A1* | 1/2023 | Matsumoto | H01L 24/80 |

FOREIGN PATENT DOCUMENTS

| | | |
|---|---|---|
| JP | 2018-160519 A | 10/2018 |
| JP | 2020-025115 A | 2/2020 |
| JP | 2021-089979 A | 6/2021 |
| WO | 2021/111893 A1 | 6/2021 |

\* cited by examiner

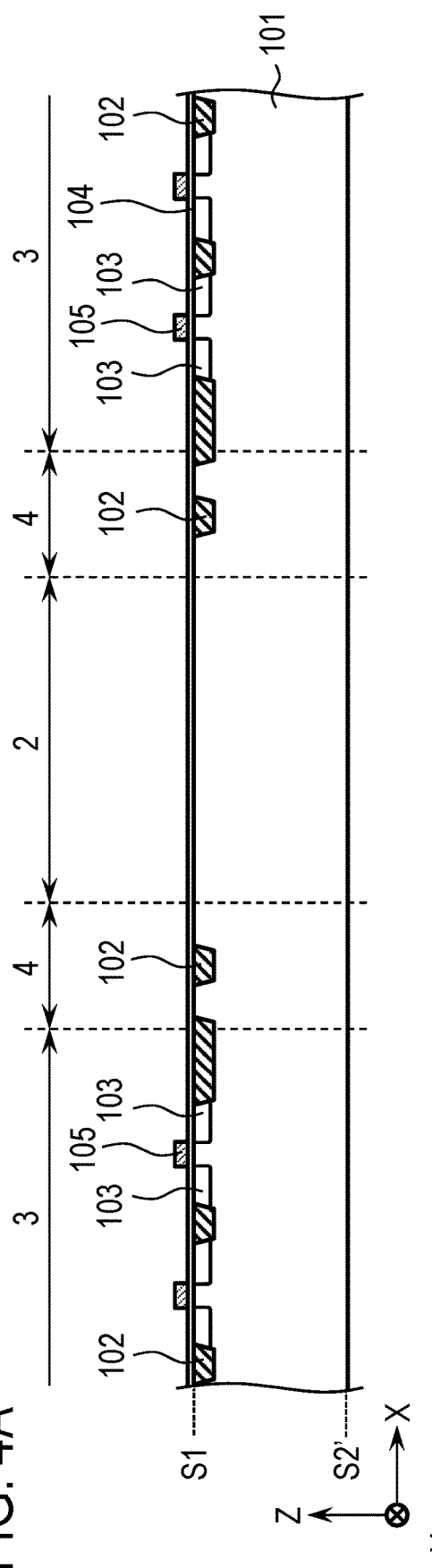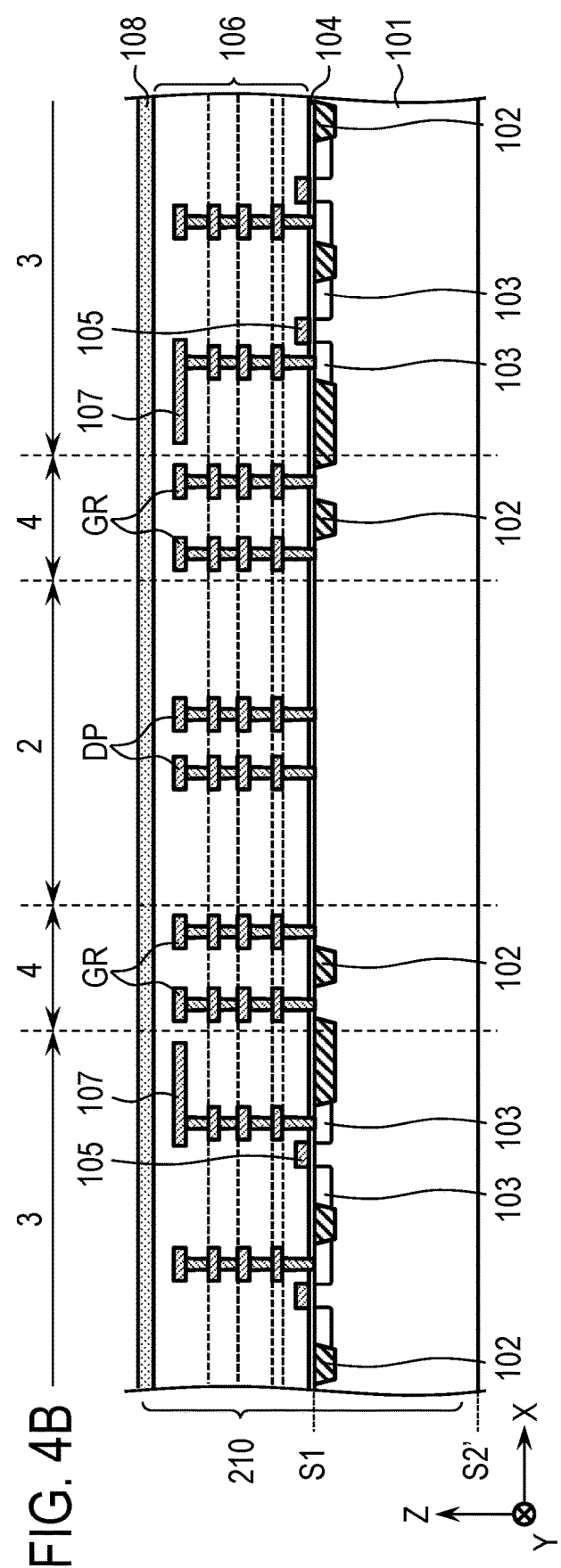

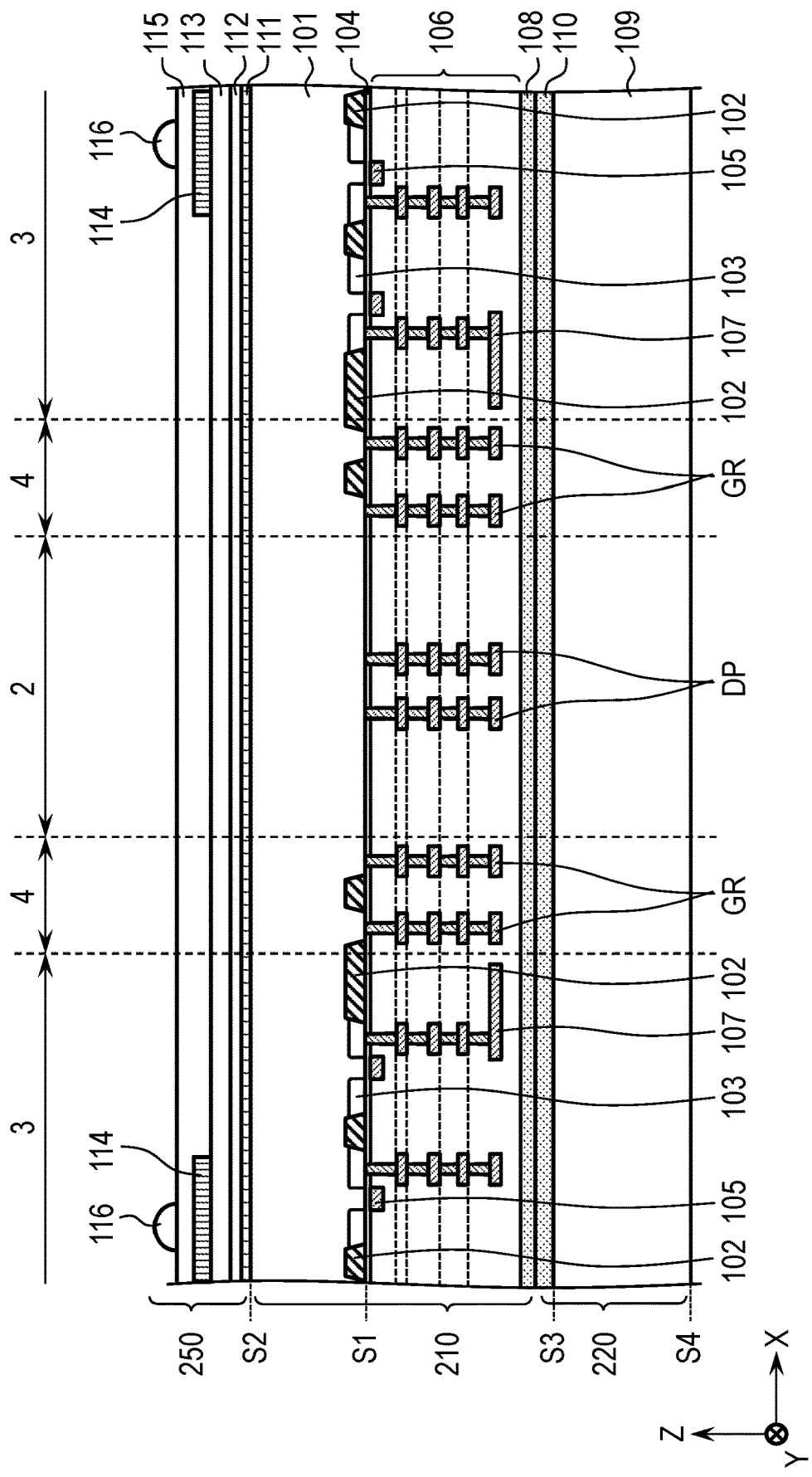

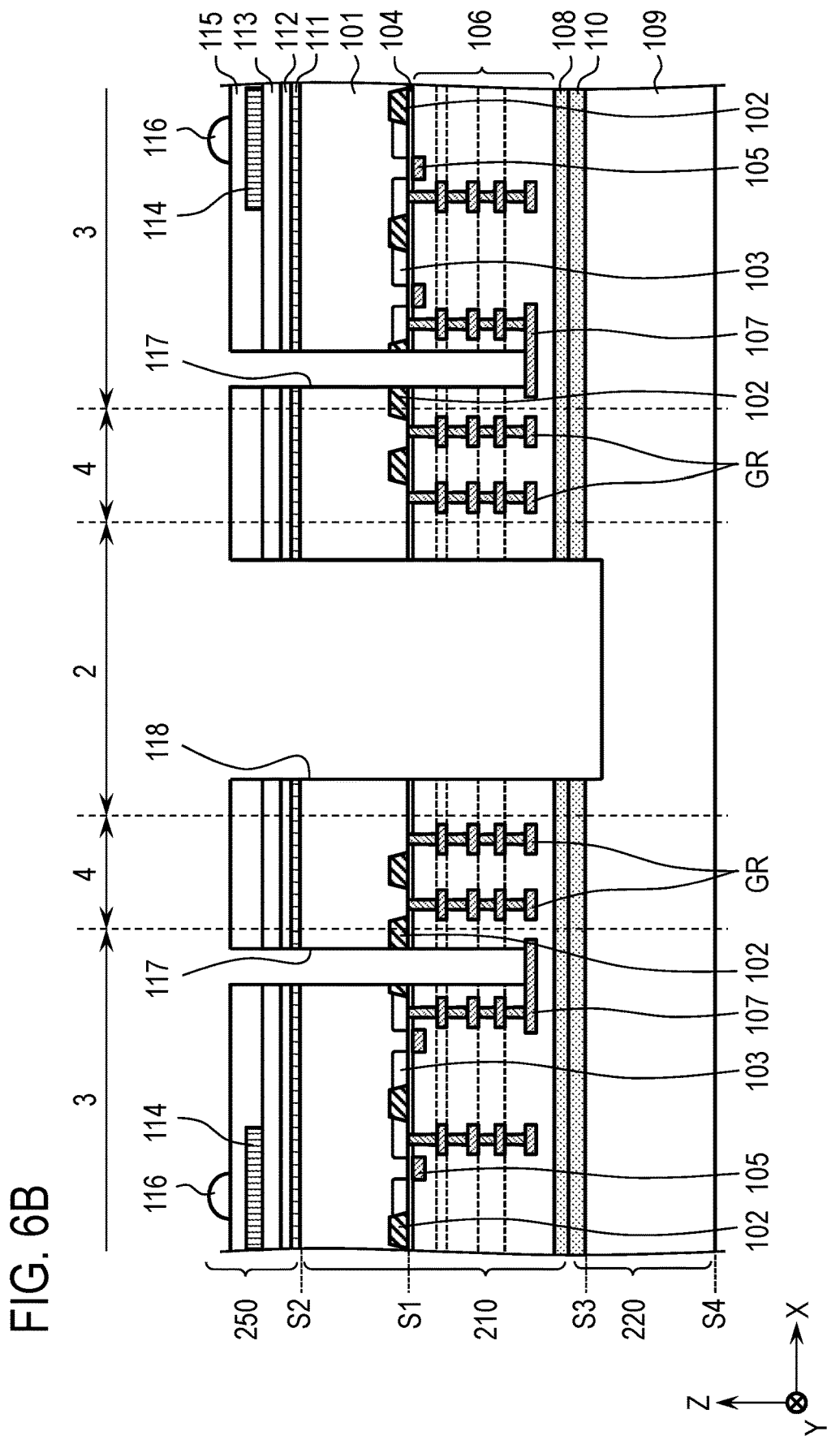

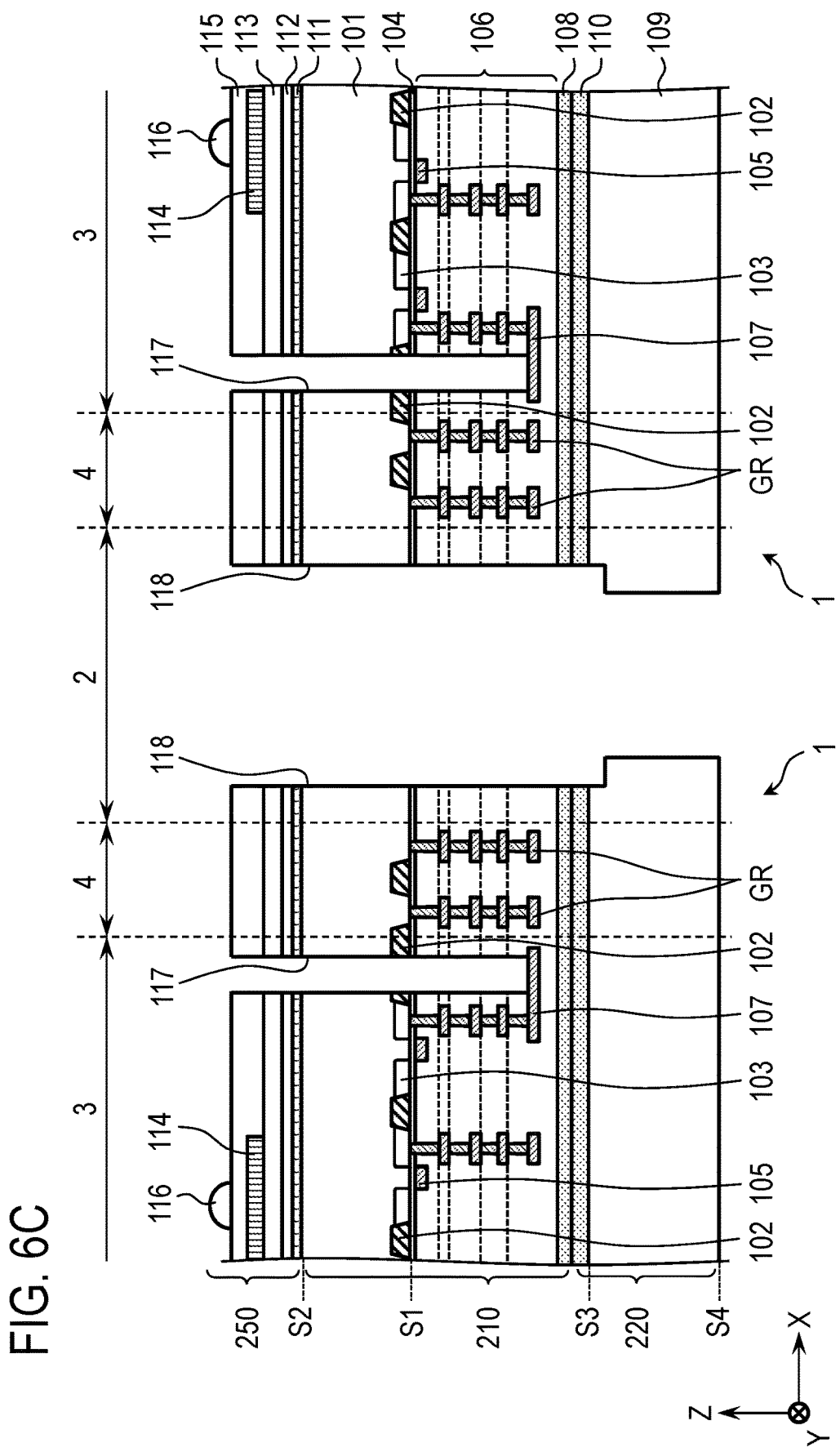

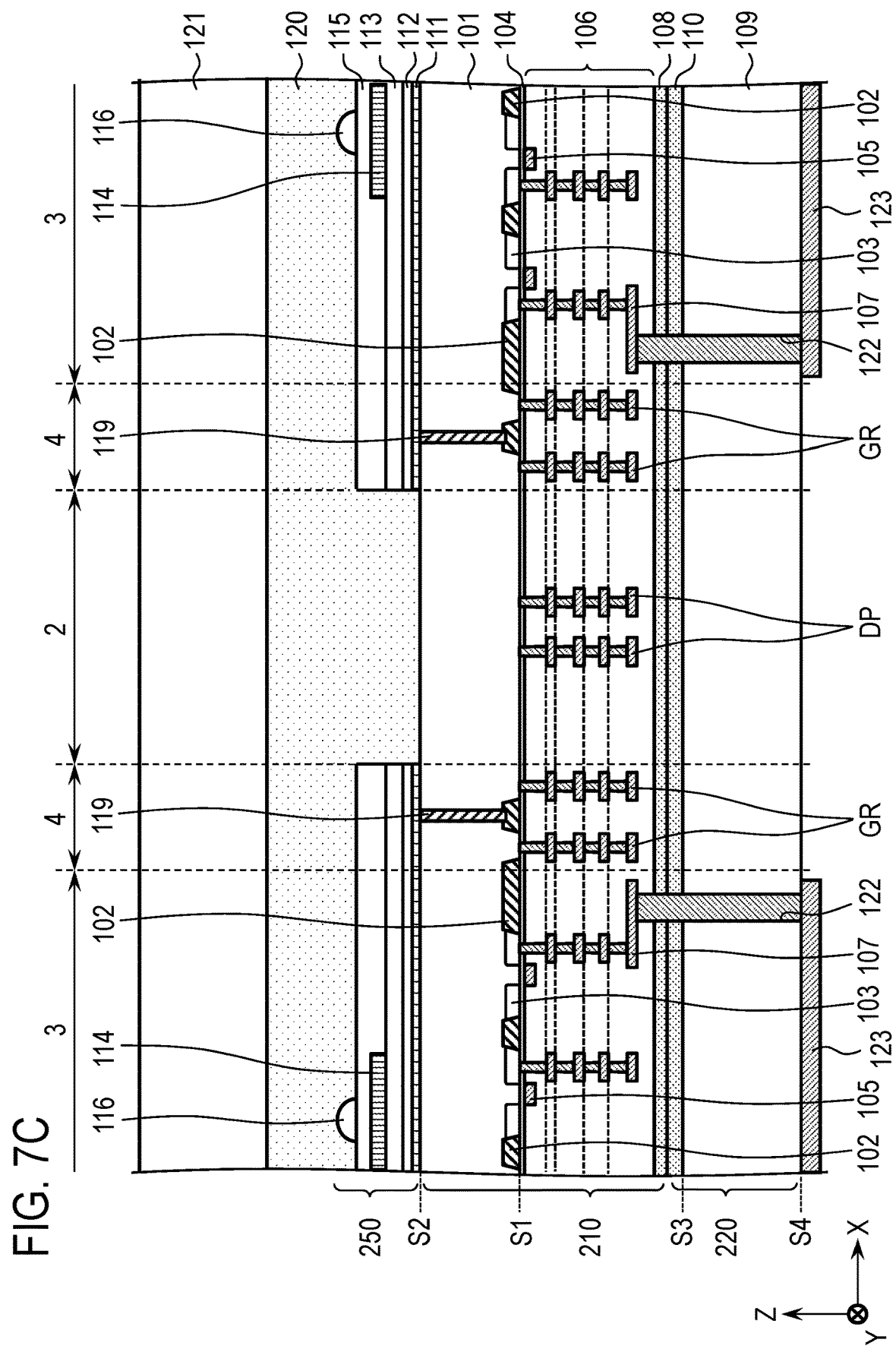

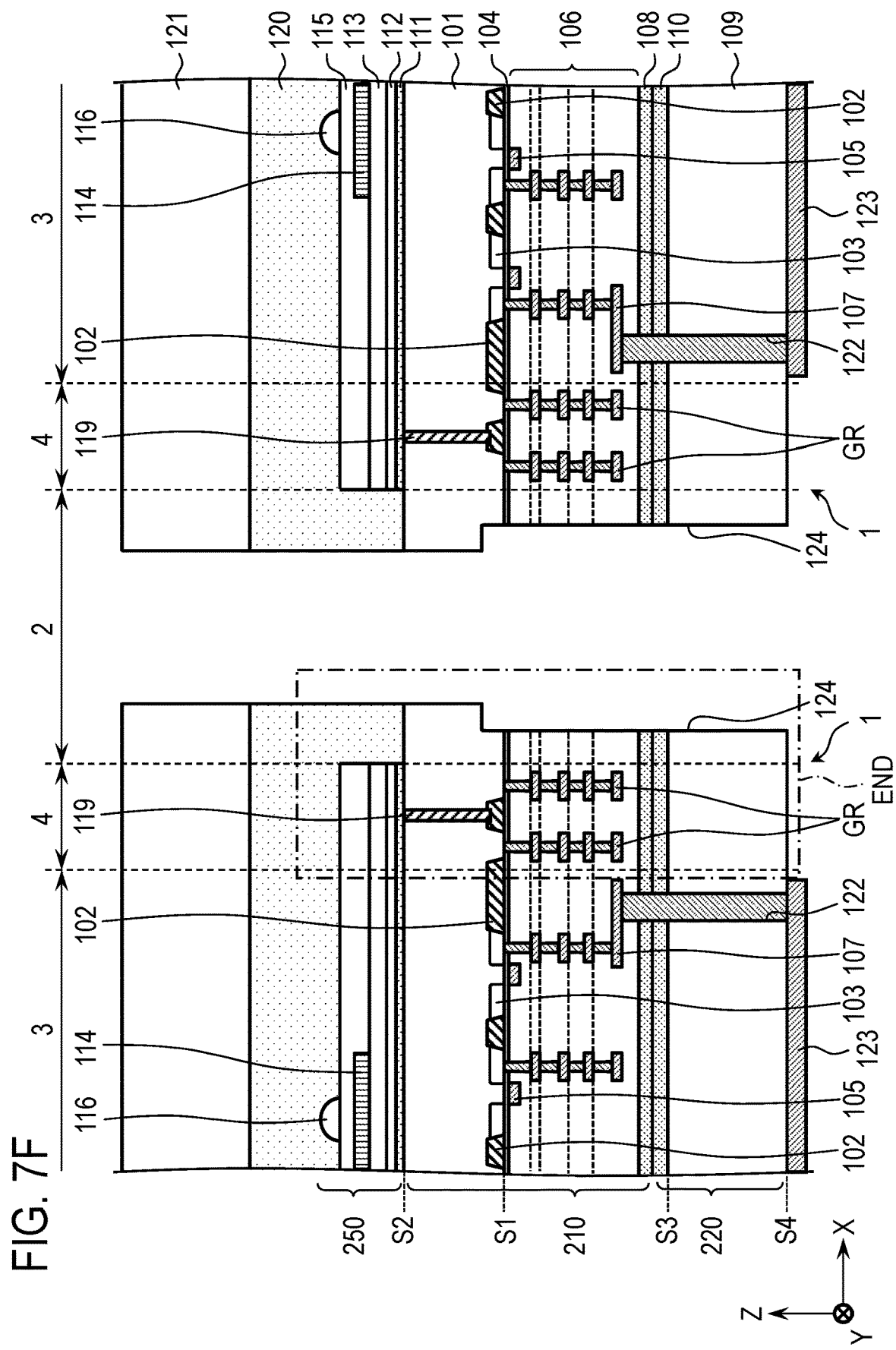

SEMICONDUCTOR DEVICE AND METHOD OF MANUFACTURING SEMICONDUCTOR DEVICE

BACKGROUND OF THE INVENTION

Field of the Invention

The present invention relates to a semiconductor device and a method of manufacturing the semiconductor device.

Description of the Related Art

Japanese Patent Application Laid-Open No. 2020-025115 discloses a method of manufacturing a semiconductor device in which chipping on a cut surface of a semiconductor substrate is avoided by dicing the semiconductor substrate by dry etching in a step of singulating the semiconductor substrate provided with a circuit.

Japanese Patent Application Laid-Open No. 2018-022924 discloses a manufacturing method in which a groove is formed inside an outer edge of a semiconductor device along a dicing line by dry etching in a step of singulating a semiconductor device in which a semiconductor substrate provided with a circuit and a support substrate are bonded. This groove can serve as a groove for preventing cracks from occurring inside the semiconductor device by dicing.

However, in the techniques described in Japanese Patent Application Laid-Open No. 2020-025115 and Japanese Patent Application Laid-Open No. 2018-022924, it is not always possible to sufficiently suppress the occurrence of cracks in the inside of the semiconductor device when the substrate is diced into individual pieces.

SUMMARY OF THE INVENTION

An object of the present invention is to provide a method of manufacturing a semiconductor device including a step of singulating a substrate into individual semiconductor devices by a dicing process, wherein cracks may be effectively suppressed from occurring inside the semiconductor device.

According to one disclosure of the present specification, there is provided a method of manufacturing a semiconductor device including singulating a bonded substrate formed by bonding a first substrate having a first main surface and a second main surface and provided with a first interconnection structure layer and a first bonding layer on a side of the first main surface in this order and a second substrate having a third main surface and a fourth main surface and provided with a second bonding layer on a side of the third main surface so that the first bonding layer and the second bonding layer face each other into a plurality of semiconductor devices, wherein the bonded substrate includes a plurality of functional element regions and a scribe region in a plan view, wherein the singulating includes forming a groove in the scribe region, and cutting the bonded substrate in a region outside an inner side surface of the groove, wherein in the forming the groove, the groove penetrating one of the first substrate and the second substrate, the first interconnection structure layer, the first bonding layer, and the second bonding layer is formed, and wherein the groove extends from the one of the first substrate and the second substrate to a position deeper than all interconnection layers provided between the first substrate and the second substrate.

According to another disclosure of the present specification, there is provided a method of manufacturing a semiconductor device including singulating a bonded substrate formed by bonding a first substrate having a first main surface and a second main surface and provided with a first interconnection structure layer and a first bonding layer on a side of the first main surface in this order and a second substrate having a third main surface and a fourth main surface and provided with a second interconnection structure layer including an interconnection layer and a second bonding layer on a side of the third main surface in this order so that the first bonding layer and the second bonding layer face each other into a plurality of semiconductor devices, wherein the bonded substrate includes a plurality of functional element regions and a scribe region in a plan view, wherein the singulating includes forming a groove in the scribe region, and cutting the bonded substrate in a region outside an inner side surface of the groove, and wherein the forming the groove, the groove penetrating one of the first substrate and the second substrate, the first interconnection structure layer, the interconnection layer, the first bonding layer, and the second bonding layer.

According to still another disclosure of the present specification, there is provided a method of manufacturing a semiconductor device including singulating a bonded substrate formed by bonding a first substrate having a first main surface and a second main surface and provided with a first interconnection structure layer and a first bonding layer on a side of the first main surface in this order and a second substrate having a third main surface and a fourth main surface and provided with a second bonding layer on a side of the third main surface so that the first bonding layer and the second bonding layer face each other into a plurality of semiconductor devices, wherein the bonded substrate includes a plurality of functional element regions and a scribe region in a plan view, and a groove formed in the scribe region so as to penetrate one of the first substrate and the second substrate, the first interconnection structure layer, the first bonding layer, and the second bonding layer, and wherein in the singulating, the bonded substrate is cut in a region outside an inner side surface of the groove.

Further features of the present invention will become apparent from the following description of exemplary embodiments with reference to the attached drawings.

BRIEF DESCRIPTION OF THE DRAWINGS

FIG. 4A, FIG. 4B, FIG. 4C, FIG. 4D, FIG. 4E, FIG. 4F, FIG. 4G, and FIG. 4H are cross-sectional views illustrating a method of manufacturing the semiconductor device according to the first embodiment of the present invention.

FIG. 6A, FIG. 6B, and FIG. 6C are cross-sectional views illustrating a method of manufacturing a semiconductor device according to a second embodiment of the present invention.

FIG. 7A, FIG. 7B, FIG. 7C, FIG. 7D, FIG. 7E, FIG. 7F, and FIG. 7G are cross-sectional views illustrating a method of manufacturing a semiconductor device according to a third embodiment of the present invention.

DESCRIPTION OF THE EMBODIMENTS

Preferred embodiments of the present invention will now be described in detail in accordance with the accompanying drawings.

In the technique described in Japanese Patent Application Laid-Open No. 2020-025115, the semiconductor layer is diced by dry etching, but the metal layer provided on the semiconductor layer is not diced by dry etching. If mechanical processing such as blade dicing is performed in such a state, chipping may occur in the inside direction of the semiconductor device at the boundary between the semiconductor layer and the metal layer, thereby affecting the function of the semiconductor device.

Further, in the technique described in Japanese Patent Application Laid-Open No. 2018-022924, since the groove for preventing cracks is formed simultaneously with openings to the interconnection layer, the groove is formed in the middle of the multilevel interconnection layer. Since the multilevel interconnection layer is formed by a stacked structure of metal layers and insulating films, chipping may occur at a boundary between the films by a mechanical processing such as blade dicing, and cracks may occur inside the semiconductor device.

In addition, as a method for preventing cracks from occurring in the inside of the semiconductor device, it is conceivable to provide a sufficient gap between the region where blade dicing is performed and the inside of the semiconductor device in which the circuit is provided, but an increase in the outer size of the semiconductor device cannot be avoided by providing the gap.

In the following embodiments, in a method of manufacturing a semiconductor device including a step of singulating a substrate into individual semiconductor devices by a dicing process, several embodiments suitable for effectively suppressing the occurrence of cracks inside the semiconductor device without increasing the outer size of the semiconductor device will be described.

First Embodiment

Figure 1:
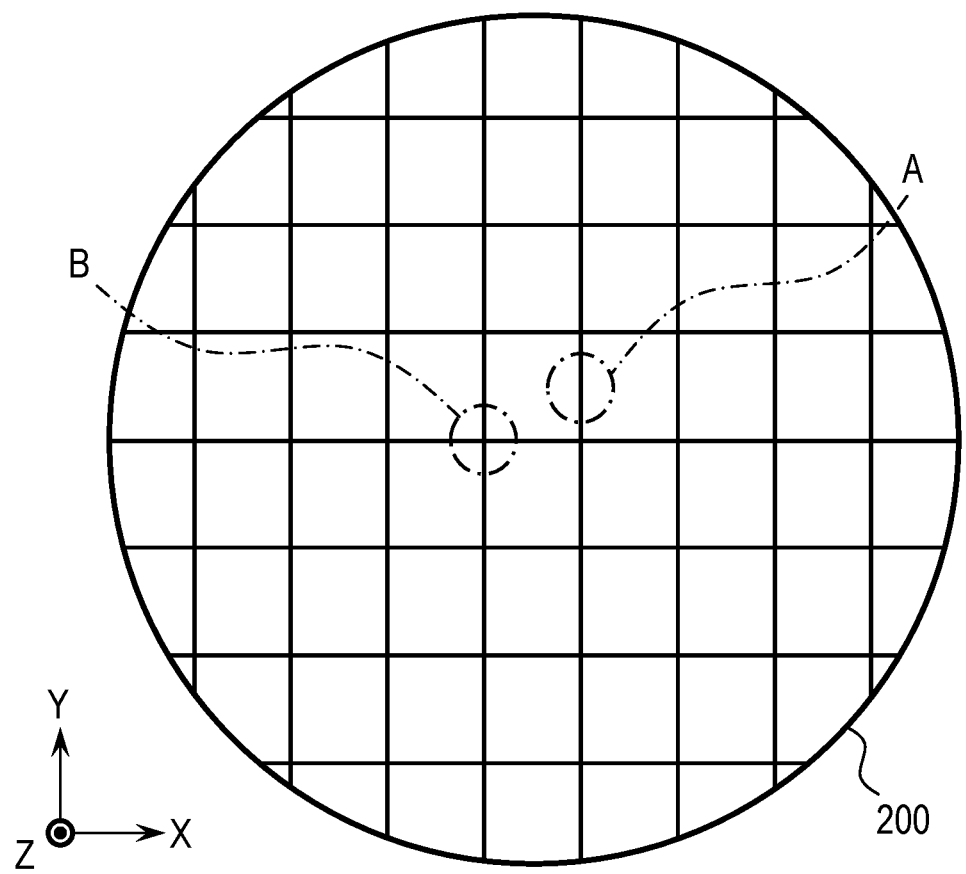
FIG. 1 is a plan view illustrating a schematic configuration of a bonded substrate prior to singulation into individual semiconductor devices.
Figure 3:
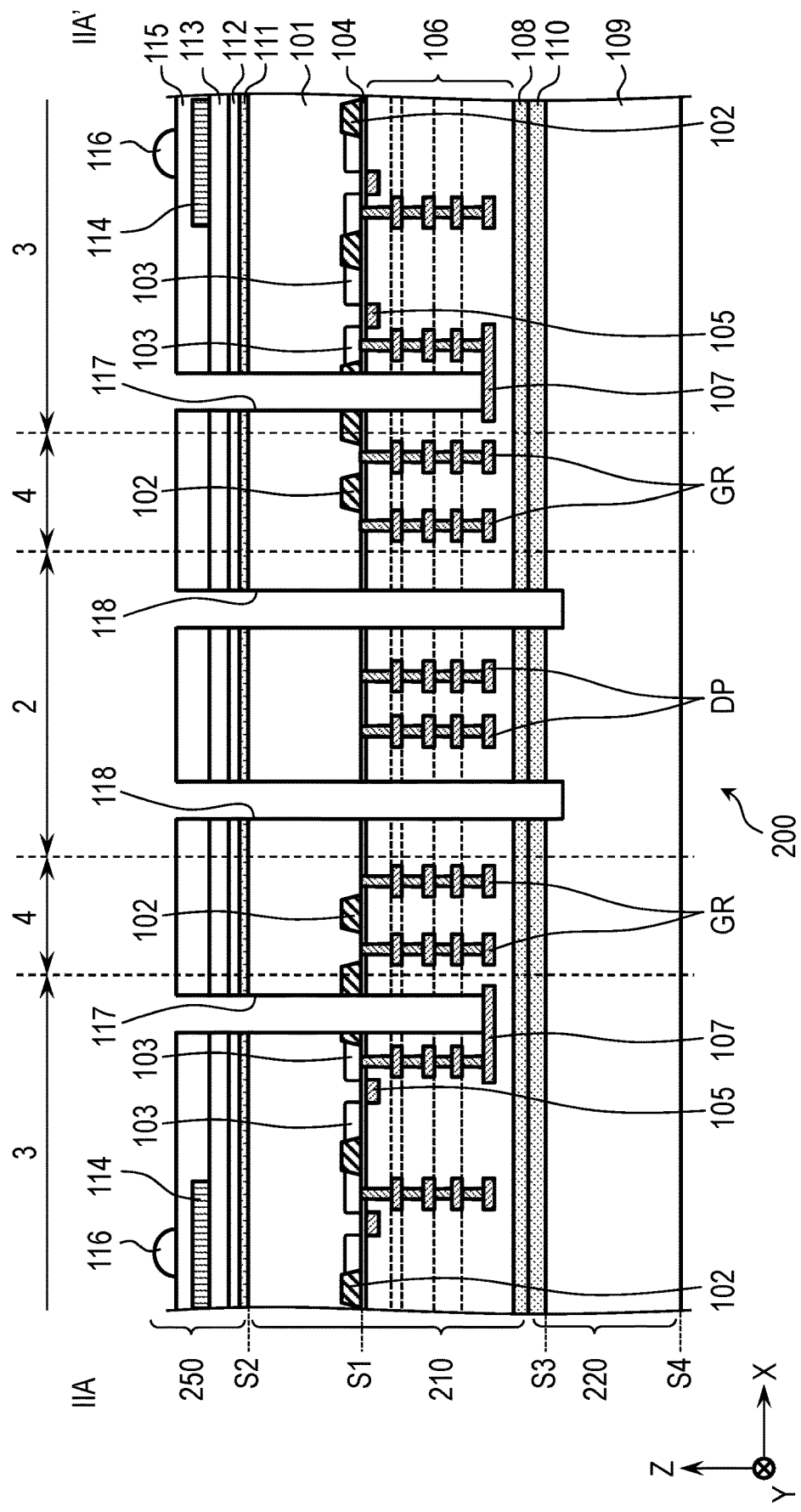
FIG. 3 is a cross-sectional view illustrating a schematic configuration of the bonded substrate prior to singulation into individual semiconductor devices.
Figure 4C:
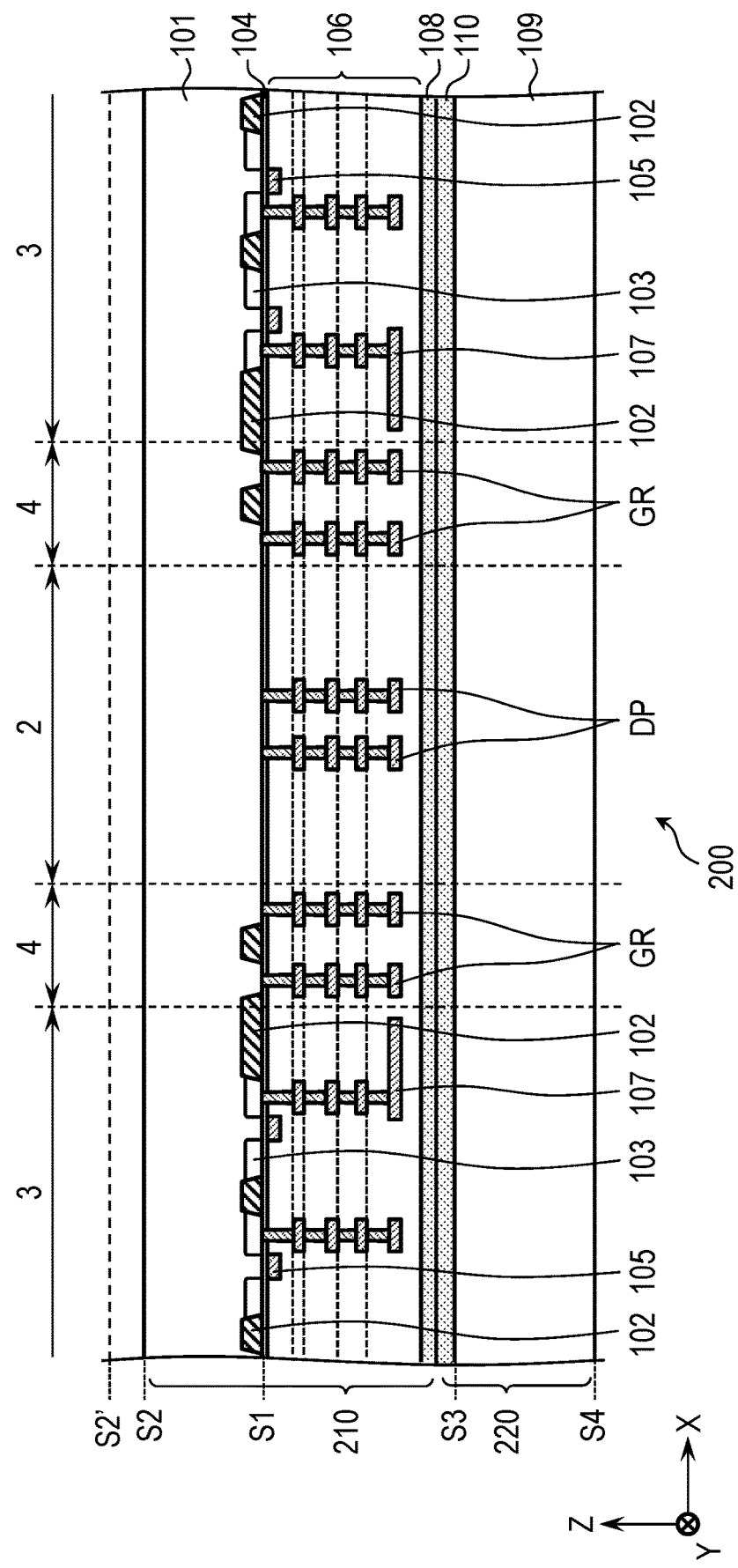

A semiconductor device and a manufacturing method the same according to a first embodiment of the present invention will be described with reference to FIG. 1 to FIG. 5. FIG. 1 is a plan view illustrating a schematic configuration of a bonded substrate prior to singulation into individual semiconductor devices. FIG. 2A to FIG. 2D are plan views illustrating a boundary portion of the semiconductor devices on the bonded substrate. FIG. 3 is a cross-sectional view illustrating a schematic configuration of the bonded substrate prior to singulation into individual semiconductor devices. FIG. 4A to FIG. 4H are cross-sectional views illustrating a method of manufacturing the semiconductor device according to the present embodiment. FIG. 5 is a plan view illustrating the structure of the semiconductor device according to the present embodiment.

The semiconductor device of the present embodiment is manufactured by dividing a bonded substrate formed by laminating and bonding a plurality of substrates into a plurality of chips. Each of the individual chips is the semiconductor device of the present embodiment.

FIG. 1 is a plan view illustrating a schematic configuration of a bonded substrate prior to singulation into individual semiconductor devices. A grid solid line illustrated in FIG. 1 represents scribe lines. Each of the regions surrounded by the scribe lines is a chip region serving as one semiconductor device. By dicing the bonded substrate 200 along the scribe lines, a plurality of semiconductor devices are obtained from one bonded substrate 200.

Figure 2A:
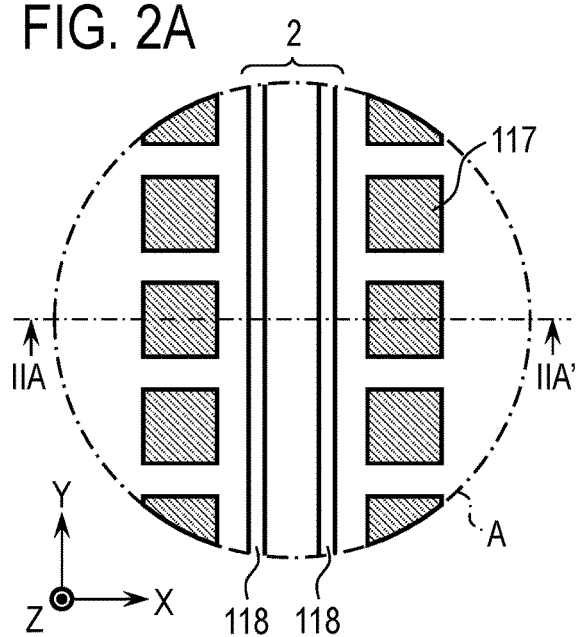
FIG. 2A, FIG. 2B, FIG. 2C, and FIG. 2D are enlarged plan views illustrating a boundary portion of the semiconductor devices on the bonded substrate.
Figure 2B:
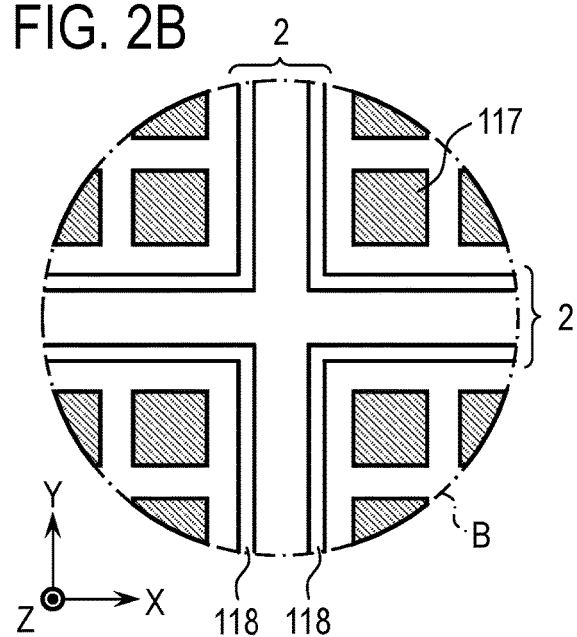
Figure 2C:
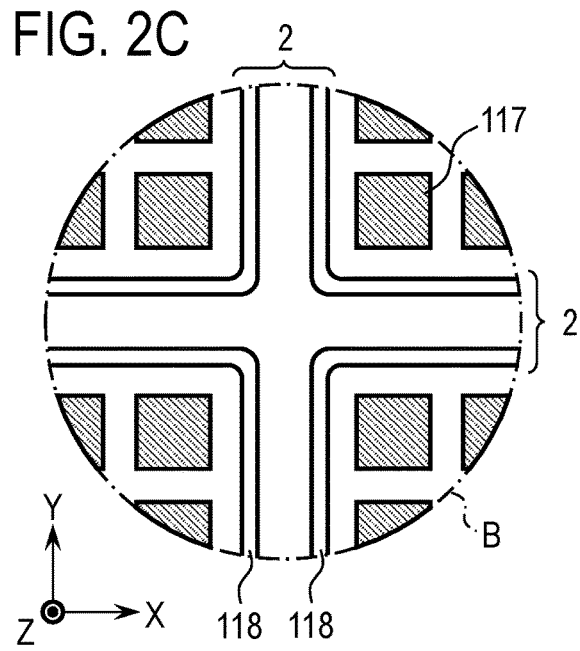
Figure 2D:
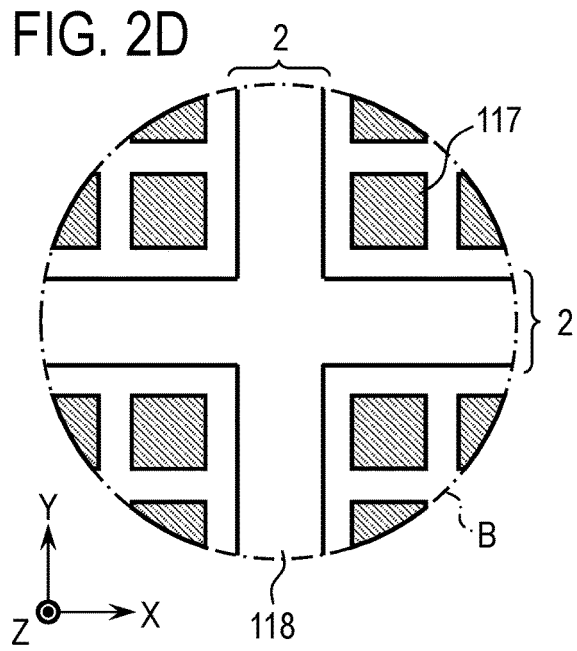

FIG. 2A to FIG. 2D are partial enlarged views of FIG. 1. FIG. 2A is an enlarged plan view of a region A in FIG. 1, illustrating a boundary portion between two adjacent semiconductor devices. FIG. 2B, FIG. 2C, and FIG. 2D are enlarged plan views of a region B in FIG. 1, illustrating a boundary portion between four adjacent semiconductor devices. FIG. 3 is a schematic cross-sectional view taken along line IIA-IIA' of FIG. 2A.

As illustrated in FIG. 3, the bonded substrate 200 includes a first component 210 including a substrate 101 having a main surface S1 and a main surface S2, a second component 220 including a substrate 109 having a main surface S3 and a main surface S4, and an optical structure layer 250. The first component 210 and the second component 220 are bonded so that the main surface S1 side of the substrate 101 and the main surface S3 side of the substrate 109 face each other. The optical structure layer 250 is provided over the main surface S2 side of the first component 210.

As illustrated in FIG. 3, the bonded substrate 200 is provided with a scribe region 2, a functional element region 3, and a guard ring region 4. The scribe region 2 corresponds to the scribe lines in FIG. 1. In the functional element region 3, a predetermined functional element corresponding to the function of the semiconductor device is provided. The guard ring region 4 is provided between the scribe region 2 and the functional element region 3 so as to surround the functional element region 3. One functional element region 3 and a guard ring region 4 surrounding the one functional element region 3 correspond to a chip region serving as one semiconductor device. Adjacent chip regions are separated from each other by a scribe region 2.

The substrate 101 may be a semiconductor substrate, such as a single crystalline silicon substrate. On the main surface S1 side of the substrate 101, an element isolation portion 102 and predetermined functional elements corresponding to the function of the semiconductor device are provided. The element isolation portion 102 has, for example, an STI (Shallow Trench Isolation) structure. FIG. 3 illustrates MOS transistors as an example of the functional elements. The MOS transistor includes source/drain regions 103 provided in the substrate 101 and a gate electrode 105 provided over the main surface S1 of the substrate 101 with a gate insulating film 104 interposed therebetween. The functional element is not limited to the MOS transistor, and may include various elements according to functions required for the semiconductor device. For example, the functional element may be a photoelectric conversion element such as a photodiode, a capacitor element, a resistor element, or a MEMS (Micro Electro Mechanical Systems) element. Here, it is assumed that the semiconductor device has a function as an optical sensor, and the functional element region 3 is provided with a photoelectric conversion unit including a photoelectric conversion element, a readout circuit for reading out a signal generated in the photoelectric conversion unit, and the like.

An interconnection structure layer 106 is provided over the main surface S1 of the substrate 101. The interconnection structure layer 106 includes an insulating film and a plurality of interconnection layers disposed in the insulating film. Although FIG. 3 illustrates a multilevel interconnection structure including four interconnection layers as the interconnection structure layer 106, the number of interconnection layers constituting the interconnection structure layer 106 is not limited to four. These interconnection layers are connected to each other via contact plugs so as to form desired circuits and structures.

The interconnection layers constituting the interconnection structure layer 106 include pad electrodes 107 provided in the functional element region 3. In the example of FIG. 3, the pad electrodes 107 are formed by the fourth-level interconnection layer most distant from the main surface S1 of the substrate 101, but the pad electrodes 107 may be formed by any interconnection layer constituting the interconnection structure layer 106. A plurality of pad electrodes 107 may be arranged in the peripheral portion of the functional element region 3 as illustrated in, e.g., FIG. 3.

In the guard ring region 4, a guard ring GR formed of the element isolation portion 102 and the interconnection layers constituting the interconnection structure layer 106 is provided. The guard ring GR is provided so as to surround the functional element region 3, and may have a function of suppressing intrusion of moisture from the outside of the semiconductor device into the functional element region 3 and damage during dicing.

A test pattern (TEG: Test Element Group) for evaluating and managing a process or a device, a dummy pattern used for a predetermined purpose, or the like may be provided in the central portion of the scribe region 2. The TEG may include, for example, a device TEG having substantially the same structure as the element provided in the functional element region 3 and used to evaluate the electrical characteristics of the element. Further, as the dummy pattern, for example, a dummy pattern for improving flatness in a chemical mechanical polishing (CMP) process performed when an interconnection layer is formed is exemplified. Here, it is assumed that dummy patterns DP made of interconnection layers constituting the interconnection structure layer 106 are provided in the scribe region 2.

A bonding layer 108 made of an insulating material such as silicon oxide or a metal material such as copper is provided over a side of the interconnection structure layer 106 opposite to the substrate 101.

The substrate 109 may be, for example, a semiconductor substrate such as a single crystalline silicon substrate. A bonding layer 110 made of an insulating material such as silicon oxide or a metal material such as copper is provided over the main surface S3 side of the substrate 109. The first component 210 and the second component 220 are bonded so that the bonding layer 108 and the bonding layer 110 face each other. In other words, the bonding layers 108 and 110 form one bonding layer integrally after the first component 210 and the second component 220 are bonded together.

An optical structure layer 250 is provided over the main surface S2 side of the substrate 101. As illustrated in FIG. 3, for example, the optical structure layer 250 includes an antireflection film 111, a light shielding layer (not illustrated), an insulating film 112, a planarization layer 113, a color filter layer 114, a planarization layer 115, and an on-chip lens 116 in this order. An antireflection film (not illustrated) made of, for example, silicon oxide may be further provided over the on-chip lens 116.

The antireflection film 111 has a function of suppressing reflection of light incident on the substrate 101 from the main surface S2 side via the optical structure layer 250 over the main surface S2. The antireflection film 111 may be formed of an insulating material such as $TaO_2$, $Ta_2O_5$, $HfO_2$, or $Al_2O_3$. These insulating materials also have an effect (pinning effect) of suppressing dark current generated at the interface (main surface S2) between the substrate 101 and the optical structure layer 250.

The light-shielding layer may be provided, for example, in a region where light-shielding pixels for outputting a reference signal that defines a reference voltage in a dark state are arranged. The light-shielding layer may be formed of a metal material or a metal compound material having light-shielding properties such as Ti, TiN, or Al. The insulating film 112 may be formed of an insulating material such as silicon oxide or silicon nitride oxide. The planarization layer 113 is a layer for planarizing unevenness of the surface caused by the light-shielding layer, and may be formed of, for example, a resin material. The color filter layer 114 has a function of selecting a wavelength band of light incident on the substrate 101, and may be formed of, for example, a resin material. The planarization layer 115 is a layer for planarizing unevenness of the surface generated by the color filter layer 114, and may be formed of, for example, a resin material. The on-chip lens 116 has a function of focusing light incident on the substrate 101.

The optical structure layer 250, the substrate 101, and the interconnection structure layer 106 are provided with openings 117 that penetrates the optical structure layer 250, the substrate 101, and a part of the interconnection structure layer 106, and reach the pad electrode 107. A guard ring (not illustrated) including the element isolation portion 102 and the interconnection layers may be further provided around each of the openings 117 to suppress entry of moisture from the openings 117.

The optical structure layer 250, the first component 210, and the second component 220 are provided with grooves 118 that penetrate the optical structure layer 250, the first component 210, and the bonding layer 110, and reach the substrate 109. As illustrated in FIG. 2A to FIG. 3, the groove 118 is provided in the scribe region 2, and has a frame-like pattern surrounding the outer periphery of the guard ring region 4 and the functional element region 3 in a plan view.

Next, a method of manufacturing the semiconductor device according to the present embodiment will be described with reference to FIG. 4A to FIG. 4H. FIG. 4A to FIG. 4H are cross-sectional views illustrating the method of manufacturing the semiconductor device according to the present embodiment.

First, a substrate 101 having a main surface S1 and a main surface S2' is prepared. The substrate 101 is a semiconductor substrate such as a single crystalline silicon substrate. Next, an element isolation portion 102 is formed in the main surface S1 side of the substrate 101 by, e.g., STI method. Next, a MOS transistor having source/drain regions 103 and a gate electrode 105 provided over the main surface S1 with a gate insulating film 104 interposed therebetween is formed in an active region defined on the main surface S1 by the element isolation portion 102 (FIG. 4A). In addition to MOS transistors, wells and other functional elements may be further formed in the substrate 101 as needed.

Next, an interconnection structure layer 106 is formed over the main surface S1 of the substrate 101 on which the element isolation portion 102 and the MOS transistor are provided. First, an interlayer insulating film made of an insulating material such as silicon oxide is formed over the main surface S1 of the substrate 101 by, e.g., CVD (Chemical Vapor Deposition) method. Next, contact holes are formed in the interlayer insulating film by photolithography and dry etching. Next, a barrier metal such as a TiN film and a tungsten film are deposited by, e.g., a sputtering method or a CVD method, and unnecessary barrier metal and tungsten film on the interlayer insulating film are removed to form contact plugs buried in the contact holes. Next, a barrier metal such as a TiN film and an aluminum film are deposited on the interlayer insulating film in which the contact plugs are buried by, e.g., a sputtering method, and then these conductive films are patterned by photolithography and dry etching to form a first-level interconnection layer. Thereafter, formation of an interlayer insulating film, formation of a via hole and a via plug, and formation of an interconnection layer are repeated to form an interconnection structure layer 106 having a predetermined number of interconnection layers.

The interconnection structure layer 106 includes predetermined interconnections and pad electrodes 107 provided in the functional element region 3, a guard ring GR provided in the guard ring region 4, and structures such as a dummy pattern DP provided in the scribe region 2. In the example illustrated in FIG. 4B, the pad electrode 107 is formed of the fourth-level interconnection layer, but the interconnection layer forming the pad electrode 107 is not particularly limited.

The interconnection layer constituting the interconnection structure layer 106 may be formed of not only aluminum interconnection but also copper interconnection. A known damascene process may be used to form the copper interconnection. Further, the interlayer insulating film constituting the interconnection structure layer 106 is mainly formed of silicon oxide, and silicon carbide, silicon nitride, or the like may be additionally used in a portion required to function as an etching stopper or a diffusion prevention film.

Next, a bonding layer 108 is formed over the interconnection structure layer 106 by, for example, CVD method or sputtering method (FIG. 4B). The bonding layer 108 may be formed of an insulating material such as silicon oxide or a metal material such as copper. Thus, the first component 210 is completed.

In addition, a substrate 109 having a main surface S3 and a main surface S4 is prepared separately from the first component 210. The substrate 109 may be, for example, a semiconductor substrate such as a single crystalline silicon substrate.

Next, a bonding layer 110 is formed over the main surface S3 of the substrate 109 by, for example, CVD method or sputtering method. Like the bonding layer 108, the bonding layer 110 may be formed of an insulating material such as silicon oxide or a metal material such as copper. Thus, the second component 220 is completed.

Next, the first component 210 and the second component 220 are stacked so that the bonding layer 108 and the bonding layer 110 face each other, and a predetermined substrate bonding process such as heat treatment is performed. Thus, the first component 210 and the second component 220 are bonded to each other to form the bonded substrate 200.

Next, the substrate 101 is thinned from the main surface S2' side by a technique such as grinding, CMP, or etching. A new surface formed by thinning the substrate 101 becomes the main surface S2 of the substrate 101 (FIG. 4C). By thinning the substrate 101, incident light from the main surface S2 side of the substrate 101 can efficiently reach the photoelectric conversion element arranged in the main surface S1 side of the substrate 101. The substrate 101 obtained by thinning the semiconductor substrate may also be referred to as a semiconductor layer.

Next, an insulating material such as $TaO_2$, $Ta_2O_5$, $HfO_2$, or $Al_2O_3$ is deposited by, for example, CVD method or sputtering method to form an antireflection film 111.

Next, a metal material or a metal compound material having a light-shielding property such as Ti, TiN, or Al is deposited over the antireflection film 111 by, e.g., sputtering method to form a light-shielding layer (not illustrated). Next, the light-shielding layer is processed into a predetermined pattern by photolithography and dry etching.

Next, an insulating material such as silicon oxide or silicon oxynitride is deposited by, e.g., CVD method over the antireflection film 111 provided with the light shielding layer to form an insulating film 112 made of the insulating material.

Next, a planarization layer 113 made of a resin material is formed over the insulating film 112 by, e.g., spin coating method. Thus, unevenness of the surface caused by the light-shielding layer is planarized by the planarization layer 113.

Next, a color filter layer 114 is formed over the planarization layer 113.

Next, a planarization layer 115 made of a resin material is formed over the planarization layer 113 provided with the color filter layer 114 by, e.g., spin coating method. Thus, the unevenness of the surface generated by the color filter layer 114 is planarized by the planarization layer 115.

Next, an on-chip lens 116 is formed over the planarization layer 115.

Thus, the optical structure layer 250 including the antireflection film 111, the light-shielding layer, the insulating film 112, the planarization layer 113, the color filter layer 114, the planarization layer 115, and the on-chip lens 116 is formed over the main surface S2 of the substrate 101 (FIG. 4D).

Next, by photolithography and dry etching, openings 117 are formed in the functional element region 3 so as to penetrate the optical structure layer 250, the substrate 101, and a part of the interconnection structure layer 106 from the main surface S2 side of the substrate 101 and reach the pad electrodes 107.

Figure 4E:
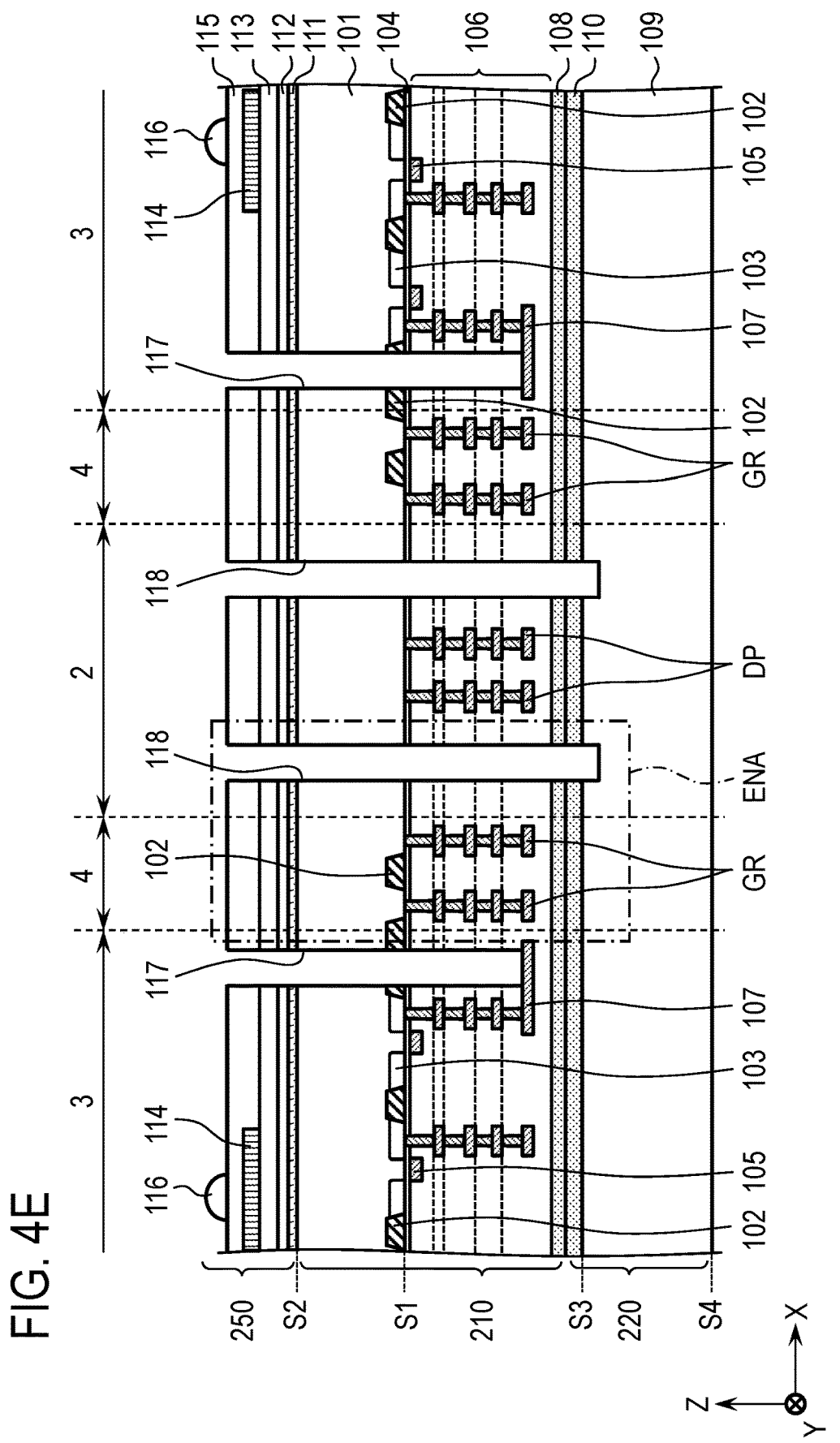
Figure 5:
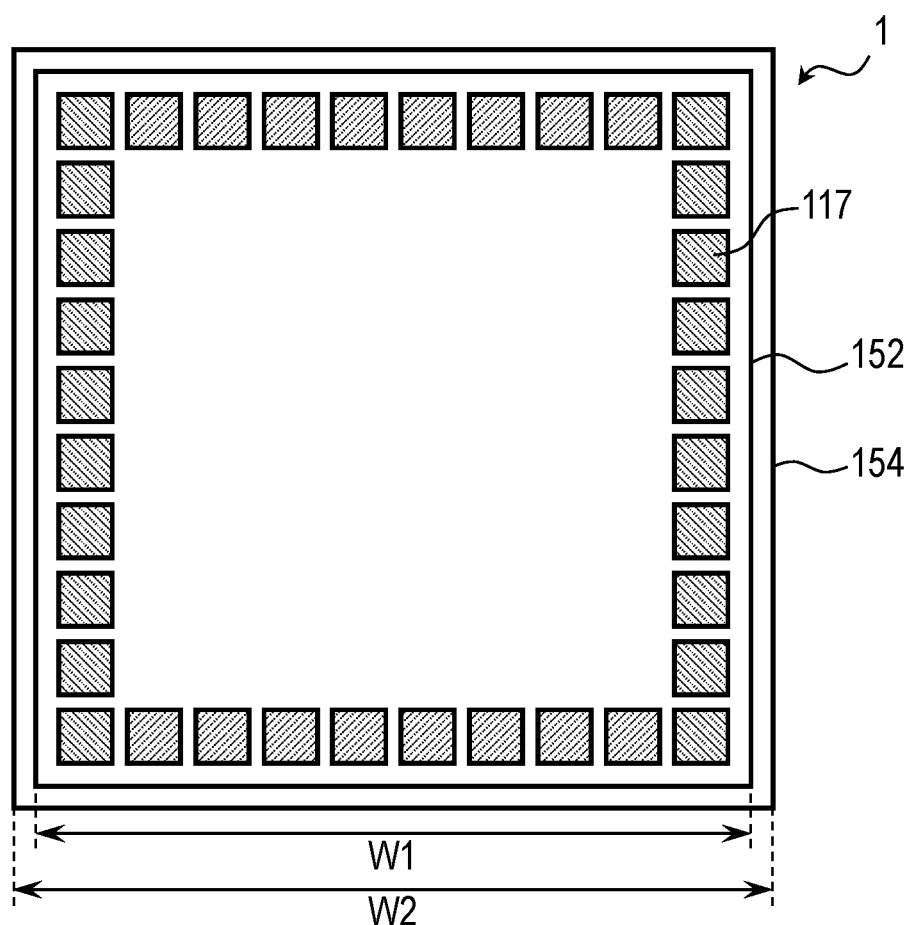
FIG. 5 is a plan view illustrating the structure of the semiconductor device according to the first embodiment of the present invention.

Further, by photolithography and dry etching, grooves 118 are formed in the scribe region 2 so as to penetrate the optical structure layer 250, the first component 210, and the bonding layer 110 from the main surface S2 side of the substrate 101 reach at least the main surface S3 of the substrate 109 (FIG. 4E). The grooves 118 extend from the main surface S2 side of the substrate 101 to a position deeper than all the interconnection layers provided between the substrate 101 and the substrate 109. Each of the grooves 118 is provided so as to surround each chip region including the guard ring region 4 and the functional element region 3 while avoiding structures such as dummy patterns DP and TEGs provided in the scribe region 2.

When the openings 117 and the grooves 118 are formed, the planarization layer 115 and the planarization layer 113 may be removed by anisotropic etching using a mixed gas containing $N_2$, $O_2$, or the like, for example. When an antireflection film is further provided over the planarization layer 115, the antireflection film may be removed by anisotropic etching using a gas containing $CF_4$ or the like, for example. The insulating film 112 and the antireflection film 111 may be removed by anisotropic etching such as capacitively coupled-type RIE (Reactive Ion Etching) using a mixed gas containing $CF_4$, $O_2$, or the like. The substrate 101 may be removed by anisotropic etching using, for example, a Bosch process. The interlayer insulating film constituting the interconnection structure layer 106 and the bonding layers 108 and 110 may be removed by anisotropic etching such as capacitively coupled-type RIE using a mixed gas containing $CF_4$, $O_2$, or the like. When the grooves 118 are formed, the grooves 118 may extend into the substrate 109 as a result. Like the etching of the substrate 101, the grooves 118 may be extended into the substrate 109 using a Bosch process.

In anisotropic etching such as capacitively coupled-type RIE, the side surfaces of the openings 117 and the grooves 118 are less uneven and may be smooth. On the other hand, in the Bosch process, a step of protecting the side wall of the opening with a gas containing $C_4F_8$ or the like and a step of performing anisotropic etching of the substrate with a gas containing $SF_6$ or the like are taken as one cycle, and the opening is extended by repeating a plurality of cycles. Therefore, in the Bosch process, unevenness called "scallop" corresponding to the number of cycles may be formed on the side surfaces of the openings 117 and the grooves 118 along the thickness direction (Z direction) of the substrate 101.

Figure 4F:
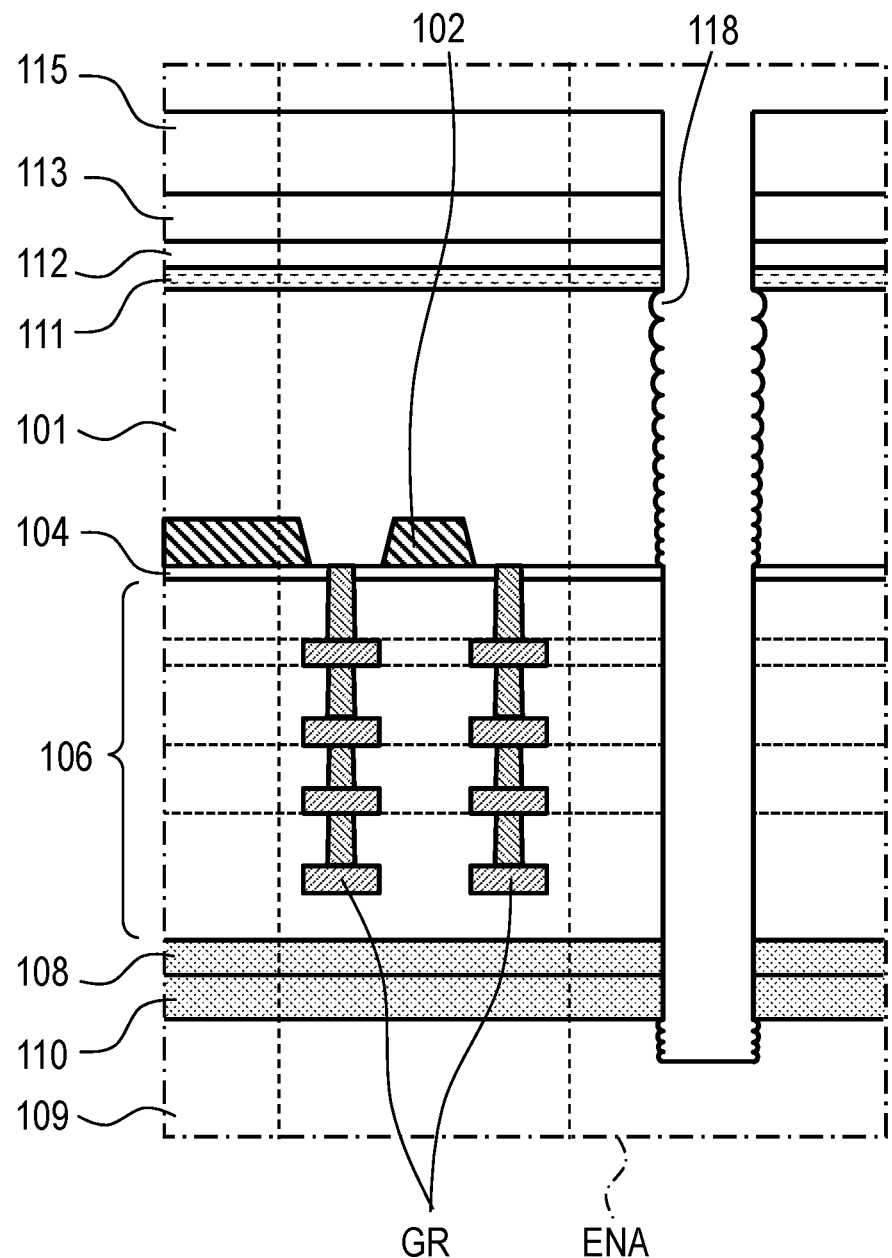

FIG. 4F is an enlarged view of the area ENA in FIG. 4E. As illustrated in FIG. 4F, the side surfaces of the groove 118 is smooth with little unevenness in the portions of the planarization layers 115 and 113, the insulating film 112, the antireflection film 111, the gate insulating film 104, the interconnection structure layer 106, and the bonding layers 108 and 110. On the other hand, in the portion of the substrate 101, a scallop corresponding to the number of cycles of the Bosch process is formed on the side surfaces of the groove 118. When the groove 118 is extended to the inside of the substrate 109 using the Bosch process, a scallop corresponding to the number of cycles of the Bosch process is formed on the side surfaces of the groove 118 also in the portion of the substrate 109. The scallop formed in the portions of the substrate 101 and the substrate 109 of the groove 118 becomes smaller toward the bottom of the groove 118 (toward the substrate 109). Like the groove 118, the side surfaces of the openings 117 are smoothed by the planarization layers 115 and 113, the insulating film 112, the antireflection film 111, the gate insulating film 104, and the interconnection structure layer 106, and a scallop corresponding to the number of cycles of the Bosch process is formed in the portion of the substrate 101.

The grooves 118 may be formed at the same time as the openings 117 to the same depth as the pad electrodes 107. Thereafter, a photoresist pattern covering the openings 117 is formed, and only the grooves 118 are extended, whereby the openings 117 and the grooves 118 having different depths may be formed.

The bent portion of the groove 118 in a plan view may be formed at a right angle as illustrated in FIG. 2B, but it is more preferable to form the bent portion so as to be round as illustrated in FIG. 2C. By making the bent portion of the groove 118 round, the corner portion of the semiconductor device which is divided into pieces may be prevented from being chipped in a later step. In addition, the photoresist film used in forming the grooves 118 is necessarily a thick film of about 10 µm in relation to forming the deep grooves 118, so that cracks may occur in the corner portions, but the occurrence of cracks may be prevented by making the corner portions round.

Figure 4G:
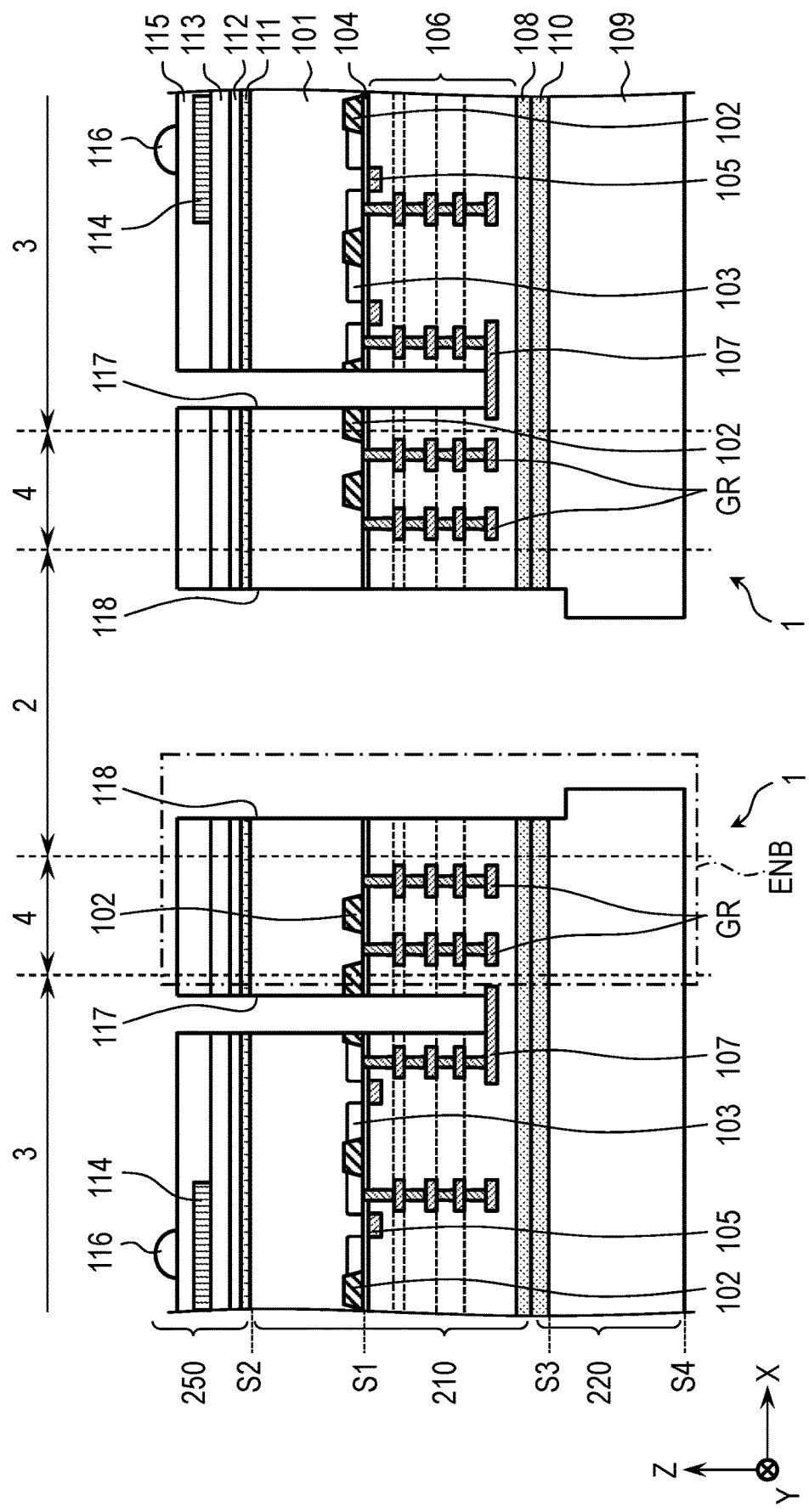

Next, the bonded substrate 200 is cut along the scribe region 2 in a region outside the inner side surface of the groove 118 by, for example, blade dicing, and the bonded substrate 200 is divided into a plurality of chips (semiconductor devices 1) (FIG. 4G). The inner side surface of the groove 118 is a side surface on the side of the guard ring region 4 and the functional element region 3 surrounded by the groove 118. The region outside the inner side surface of the groove 118 is a region closer to the central portion side of the scribe region 2 than the inner side surface of the groove 118. A region where the bonded substrate 200 is cut (a region where blade dicing is performed) may be a region between adjacent grooves 118 in the scribe region 2, or a part of the region may overlap the groove 118.

Figure 4H:
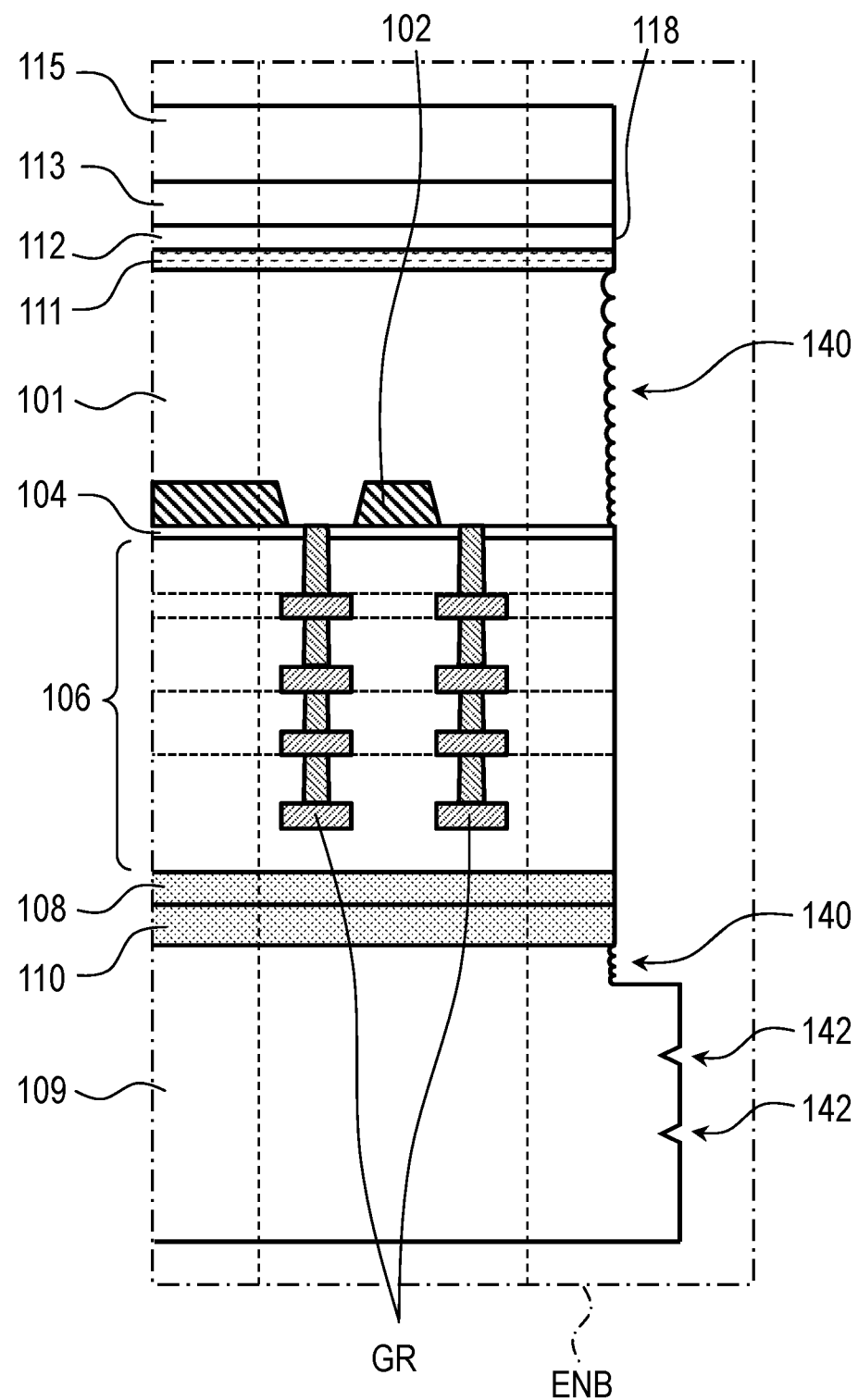

FIG. 4H is an enlarged view of the area ENB in FIG. 4G. The right side surface in FIG. 4H, that is, the inner side surface of the groove 118 and the cut surface obtained by the blade dicing process form the side surface of the semiconductor device 1 which has been singulated. Since a step having a height corresponding to the distance between the inner side surface of the groove 118 and the region where the blade dicing is performed exists between the inner side surface of the groove 118 and the cut surface by the blade dicing process, the step remains also on the side surface of the semiconductor device 1 after singulation. The scallop 140 due to the Bosch process remains in a portion of the side surface of the semiconductor device 1 corresponding to the substrates 101 and 109 in the portion of the side surface of the groove 118. In the side surface of the semiconductor device 1, a chipping 142 or cracks caused by the chipping 142 may occur in the cut surface (substrate 109) by the blade dicing process.

When the bonded substrate 200 is cut in the region between the grooves 118, even if chipping occurs during dicing, cracks due to chipping or chipping may be stopped by the grooves 118. Therefore, chipping and cracks do not propagate to the guard ring GR, the functional elements in the functional element region 3, and the interconnection structure layer 106. Further, when the bonded substrate 200 is cut in the region overlapping with the groove 118, chipping or cracking does not occur in the guard ring GR, the functional elements in the functional element region 3, and the interconnection structure layer 106 by preventing the blade from contacting the inner surface of the groove 118. In either case, chipping or cracking may occur in the substrate 109, but the function of the semiconductor device is not hindered by chipping or cracking because no functional elements or interconnection layers are provided in the substrate 109.

In the present embodiment, the interval between the region where blade dicing is performed and the guard ring GR is set in consideration of the alignment accuracy at the time of blade dicing. The distance between the region where the groove 118 is formed and the guard ring GR is set in consideration of the alignment accuracy (for example, ±1.5

μm) of the photoresist pattern when the grooves 118 are formed. On the other hand, in a general method of manufacturing a semiconductor device in which blade dicing is performed, the distance between the region in which blade dicing is performed and the guard ring GR is set in consideration of the chipping amount (for example, 5 μm or more) in addition to the alignment accuracy at the time of blade dicing.

Therefore, by using the method of manufacturing the semiconductor device according to the present embodiment, the outer size of the manufactured semiconductor device 1 may be made smaller than the outer size of a general semiconductor device manufactured using blade dicing.

FIG. 5 is a plan view of the semiconductor device 1 after singulation as viewed from the main surface S2 side of the substrate 101. The semiconductor device 1 includes a stacked structure including a second component 220, a first component 210, and an optical structure layer 250. The side surface of the stacked structure has a first portion 152 defined by the side surface of the substrate 101 and a second portion 154 defined by the side surface of the substrate 109. The first portion 152 corresponds to an inner side surface of the groove 118, and the second portion 154 corresponds to a cut surface obtained by blade dicing. In the plan view, the width W1 of the stacked structure in the portion defined by the first portion 152 is smaller than the width W2 of the stacked structure in the portion defined by the second portion 154 due to the step between the inner side surface of the groove 118 and the cut surface by the blade dicing process.

The semiconductor device 1 after singulation may be fixed to a semiconductor package substrate (not illustrated). A metal electrodes (not illustrated) electrically connected to the pad electrodes 107 may be provided in the openings 117. The metal electrodes are made of gold, silver, copper, or the like, and may be formed by wire bonding, plating, or the like. The metal electrodes are provided for the purpose of electrically connecting the semiconductor device 1 and the semiconductor package substrate.

Alternatively, a plurality of semiconductor devices 1 after singulation may be tiled on a semiconductor package substrate (not illustrated) to form one large optical sensor module. Since the outer size of the semiconductor device 1 may be reduced by using the method of manufacturing the semiconductor device according to the present embodiment, the distance between the photoelectric conversion portions of adjacent semiconductor devices 1 may be reduced. Thus, it is possible to reduce the area where the photoelectric conversion units are not arranged, and to realize an optical sensor module capable of obtaining an image in which a cut due to separation between the photoelectric conversion units is less noticeable.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Second Embodiment

Figure 6A:
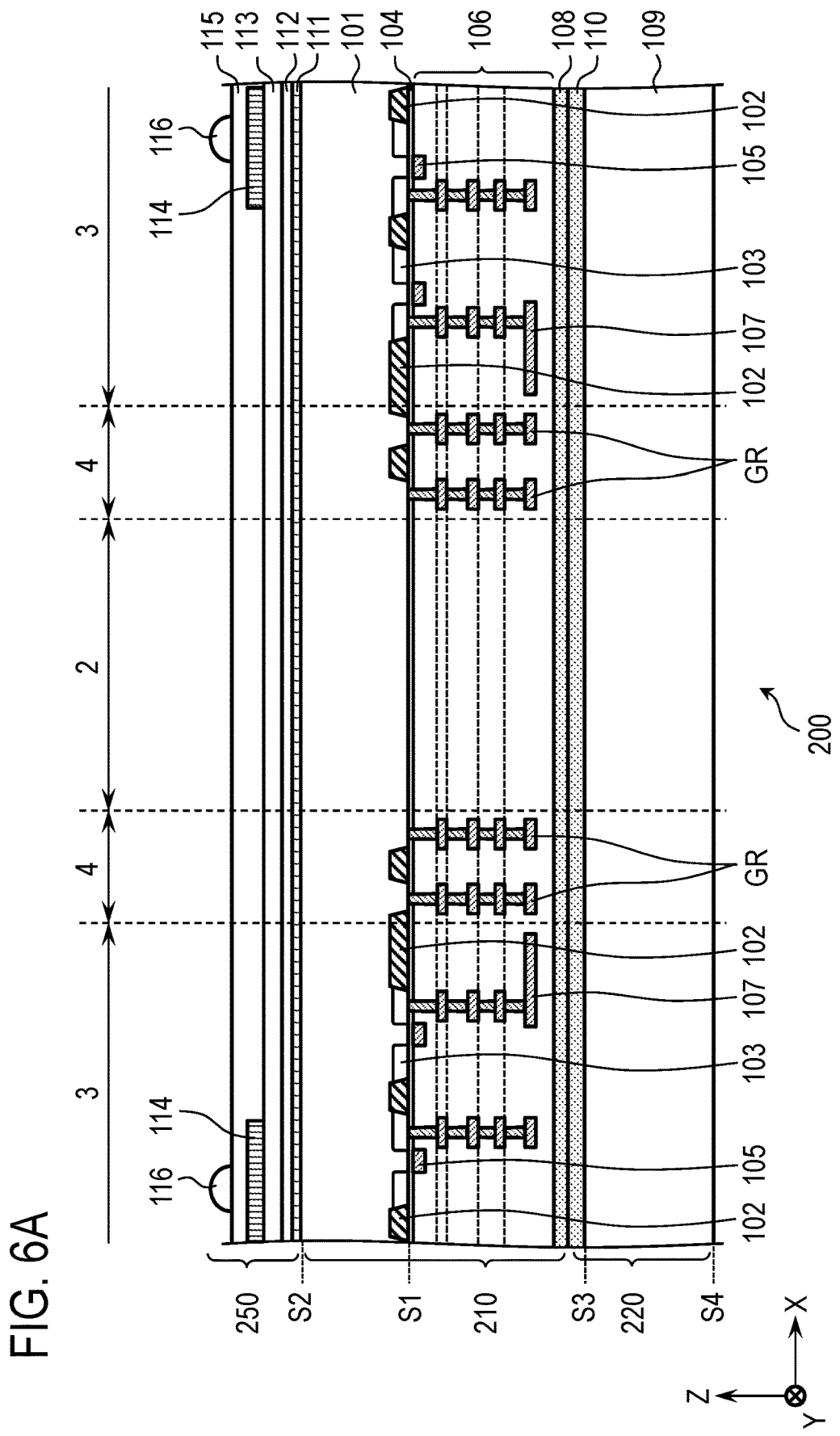

A method of manufacturing a semiconductor device according to a second embodiment of the present invention will be described with reference to FIG. 6A to FIG. 6C. The same components as those of the semiconductor device according to the first embodiment are denoted by the same reference numerals, and the description thereof will be omitted or simplified. FIG. 6A to FIG. 6C are cross-sectional views illustrating the method of manufacturing the semiconductor device according to the present embodiment.

First, a bonded substrate 200 is formed in the same manner as the method of manufacturing the semiconductor device according to the first embodiment illustrated in FIG. 4A to FIG. 4D (FIG. 6A). In the present embodiment, structures such as dummy patterns DP and TEGs are not arranged in the scribe region 2. Other points are the same as those of the first embodiment.

Next, by photolithography and dry etching, openings 117 are formed in the functional element region 3 so as to penetrate the optical structure layer 250, the substrate 101, and a part of the interconnection structure layer 106 from the main surface S2 side of the substrate 101 and reach the pad electrodes 107.

Further, by photolithography and dry etching, a groove 118 is formed in the scribe region 2 so as to penetrate the optical structure layer 250, the first component 210, and the bonding layer 110 from the main surface S2 side of the substrate 101 and reach at least the main surface S3 of the substrate 109 (FIG. 6B). In the present embodiment, since the structures such as dummy patterns DP and TEGs are not provided in the scribe region 2, the groove 118 may also be formed in the central portion of the scribe region 2. That is, the grooves 118 individually provided so as to surround each of the chip regions in the first embodiment may be formed to be connected to each other (see FIG. 2D).

Next, the bonded substrate 200 is cut along the scribe region 2 in a region inside both side surfaces of the groove 118, and the bonded substrate 200 is divided into a plurality of chips (semiconductor devices 1) (FIG. 6C). The inner surface of the groove 118 and the cut surface obtained by the dicing process form the side surface of the individual semiconductor device 1. The generation of steps, scallops, and chipping on the side surfaces of the semiconductor device 1 is the same as in the first embodiment. Note that the bonded substrate 200 may be cut by laser dicing using laser light in addition to the blade dicing process similar to the first embodiment.

When the bonded substrate 200 is cut in a region inside both side surfaces of the groove 118 so that the blade does not contact the side surface of the groove 118 during the dicing process, chipping or cracks caused by the dicing do not enter the guard ring region 4 or the functional element region 3 of the first component 210. Although there is a possibility that chipping or cracks may occur in the substrate 109 by the dicing process, the function of the semiconductor device 1 is not hindered by the occurrence of chipping or cracks because no functional elements or interconnection layers are provided in the substrate 109.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Third Embodiment

A method of manufacturing a semiconductor device according to a third embodiment of the present invention will be described with reference to FIG. 7A to FIG. 7G. The same components as those of the semiconductor device according to the first or second embodiment are denoted by the same reference numerals, and the description thereof will be omitted or simplified. FIG. 7A to FIG. 7G are cross-sectional views illustrating the method of manufacturing the semiconductor device according to the present embodiment.

In the present embodiment, an example in which the present invention is applied to WLCSP (Wafer-Level Chip-Size Package) is described. The WLCSP is a technique in which packaging is performed as it is in a wafer state, and then the wafer is divided into a plurality of semiconductor devices.

First, the first component 210 and the second component 220 are bonded together in the same manner as in the method of manufacturing the semiconductor device according to the first embodiment illustrated in FIG. 4A to FIG. 4C.

Next, by using, for example, a DTI (Deep Trench Isolation) technique, insulating structures 119 reaching the element isolation portion 102 from the main surface S2 of the substrate 101 are formed in the guard ring region 4. Like the guard ring GR, each of the insulating structures 119 is provided so as to surround the functional element region 3, and may function as an internal circuit protection unit for protecting an internal circuit provided in the functional element region 3. The insulating structures 119 may be provided not only in the guard ring region 4 but also in the functional element region 3. For example, the insulating structures 119 provided in the functional element region 3 may be used as a structure for optically and electrically isolating adjacent photoelectric conversion units. The insulating structures 119 may be formed of an insulating material such as silicon nitride or silicon oxide.

Figure 7A:
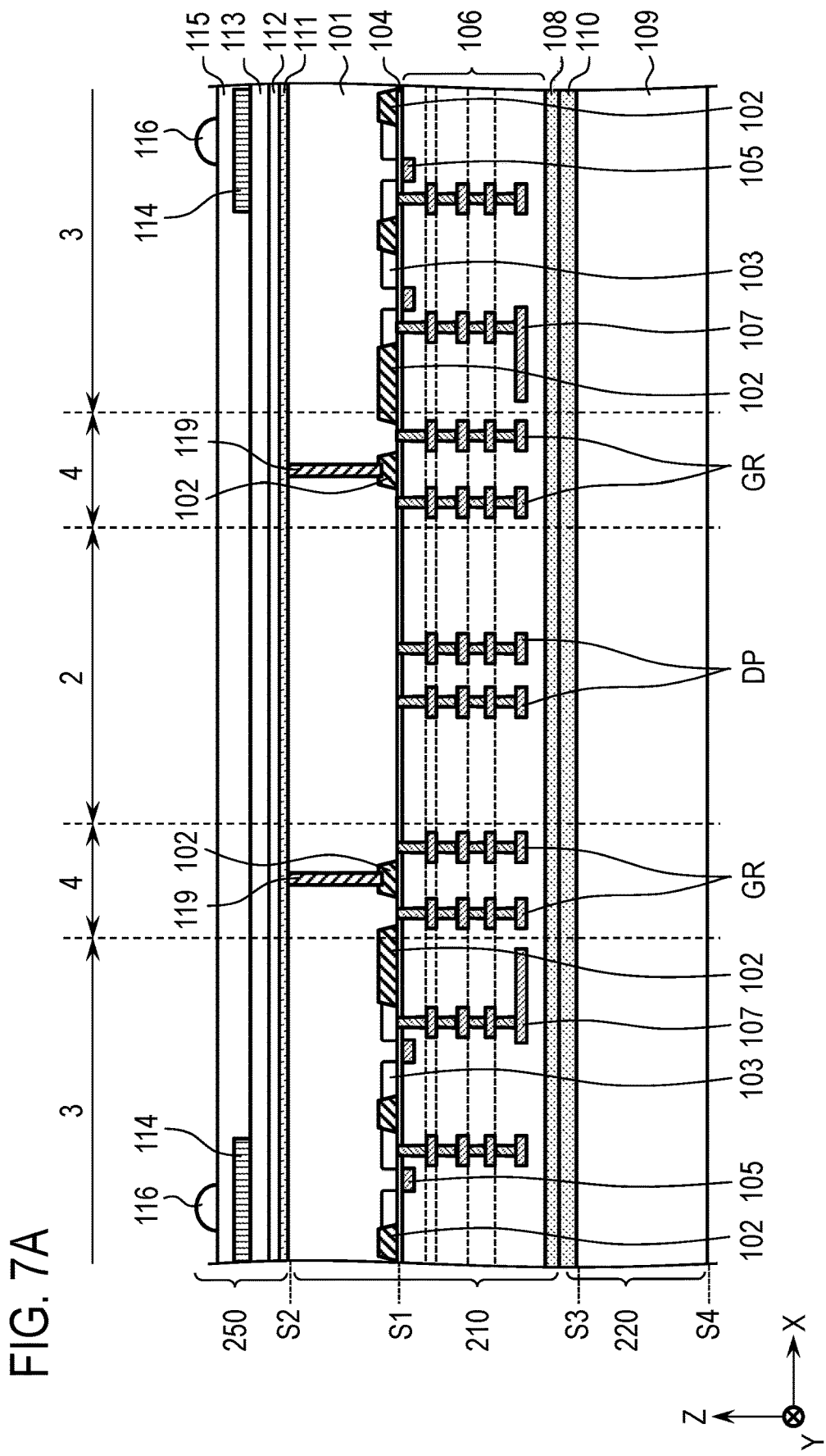

Next, over the main surface S2 of the substrate 101, the optical structure layer 250 including the antireflection film 111, the light shielding layer, the insulating film 112, the planarization layer 113, the color filter layer 114, the planarization layer 115, and the on-chip lens 116 is formed in the same manner as in the first embodiment (FIG. 7A).

Next, the planarization layers 115 and 113, the insulating film 112, and the antireflection film 111 in the scribe region 2 are removed by photolithography and dry etching. The planarization layers 115 and 113, the insulating film 112, and the antireflection film 111 may be etched under etching conditions for forming the openings 117 and the grooves 118. Thus, the end portion of the optical structure layer 250 is located inside the scribe region 2.

Figure 7B:
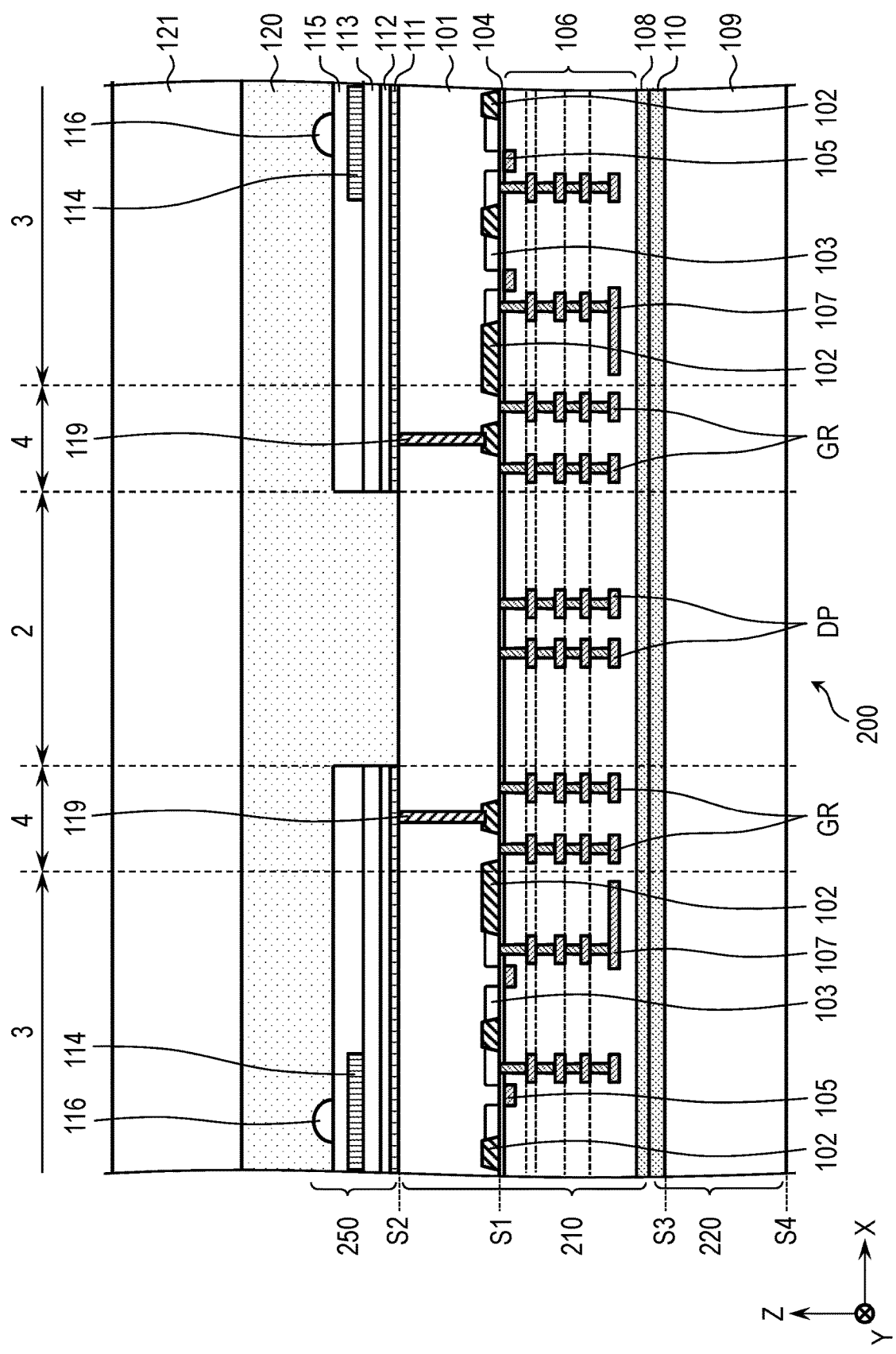

Next, the support substrate 121 is bonded to the main surface S2 side of the substrate 101 provided with the optical structure layer 250 via the adhesive layer 120, to thereby form the bonded substrate 200 (FIG. 7B). The support substrate 121 may be a semiconductor substrate such as a single crystalline silicon substrate, or an insulating substrate such as a glass substrate or a ceramic substrate. When the semiconductor device 1 is an optical sensor, the support substrate 121 is preferably a light transmitting substrate, for example, a light transmitting plate made of quartz glass. After the support substrate 121 is bonded, the substrate 109 is thinned from the main surface S4 side as necessary. A technique such as grinding, CMP, or etching may be used for thinning the substrate 109. The substrate 109 obtained by thinning the semiconductor substrate may also be referred to as a semiconductor layer.

Next, by photolithography and dry etching, openings 122 are formed so as to penetrate the substrate 109, the bonding layers 110 and 108, and a part of the interconnection structure layer 106 from the main surface S4 side of the substrate 109 and reach the pad electrodes 107. Like the substrate 101, the substrate 109 may be removed by anisotropic etching using, for example, a Bosch process. The bonding layers 110 and 108 and the interlayer insulating films of the interconnection structure layer 106 may be removed by anisotropic etching such as capacitively coupled-type RIE using a mixed gas containing $CF_4$, $C_4F_8$, $O_2$, Ar, or the like. When the openings 122 are formed, an inorganic film on which a pattern of the photoresist film is transferred may be used as a mask instead of the photoresist film.

Next, an insulating material such as silicon nitride or silicon oxide is deposited over the entire surface of the main surface S4 side of the substrate 109 including the side surfaces and the bottom surfaces of the openings 122 by, e.g., CVD method, to thereby form an insulating film (not illustrated). Next, the deposited insulating film is anisotropically etched by capacitively coupled-type RIE or the like using a mixed gas containing $CF_4$, $C_4F_8$, $O_2$, Ar or the like. Thus, the insulating film deposited on the pad electrodes 107 on the bottom surface of the openings 122 is removed.

Next, a barrier metal and a metal layer to be a seed layer (none of which are illustrated) are deposited over the entire surface of the main surface S4 side of the substrate 109 including the inside of the openings 122 by, e.g., sputtering method. The barrier metal may be, for example, titanium. The seed layer may be, for example, copper.

Next, a photoresist film (not illustrated) is formed over the seed layer by photolithography to expose regions where the metal interconnections 123 connected to the pad electrodes 107 are to be formed and cover the other regions.

Next, a metal layer is grown on the seed layer by electrolytic plating using the photoresist film as a mask and the seed layer as a seed, to thereby form an electrode buried in the openings 122 and metal interconnections 123 connected to the pad electrodes 107 via the electrodes. The seed layer and the barrier metal in the portion covered with the photoresist film are removed by wet etching or the like after the photoresist film is removed. Such an electrode (through electrode) provided through a substrate (silicon substrate) is called a TSV (Through Silicon Via).

Next, a solder resist (not illustrated) for protecting the metal interconnections 123 is coated over the main surface S4 of the substrate 109 on which the metal interconnections 123 are provided. Next, openings serving as regions for forming solder balls or solder bumps are formed in the solder resist.

In this manner, the bonded substrate 200 including the substrates 101 and 109 and the support substrate 121 is formed (FIG. 7C).

Figure 7D:
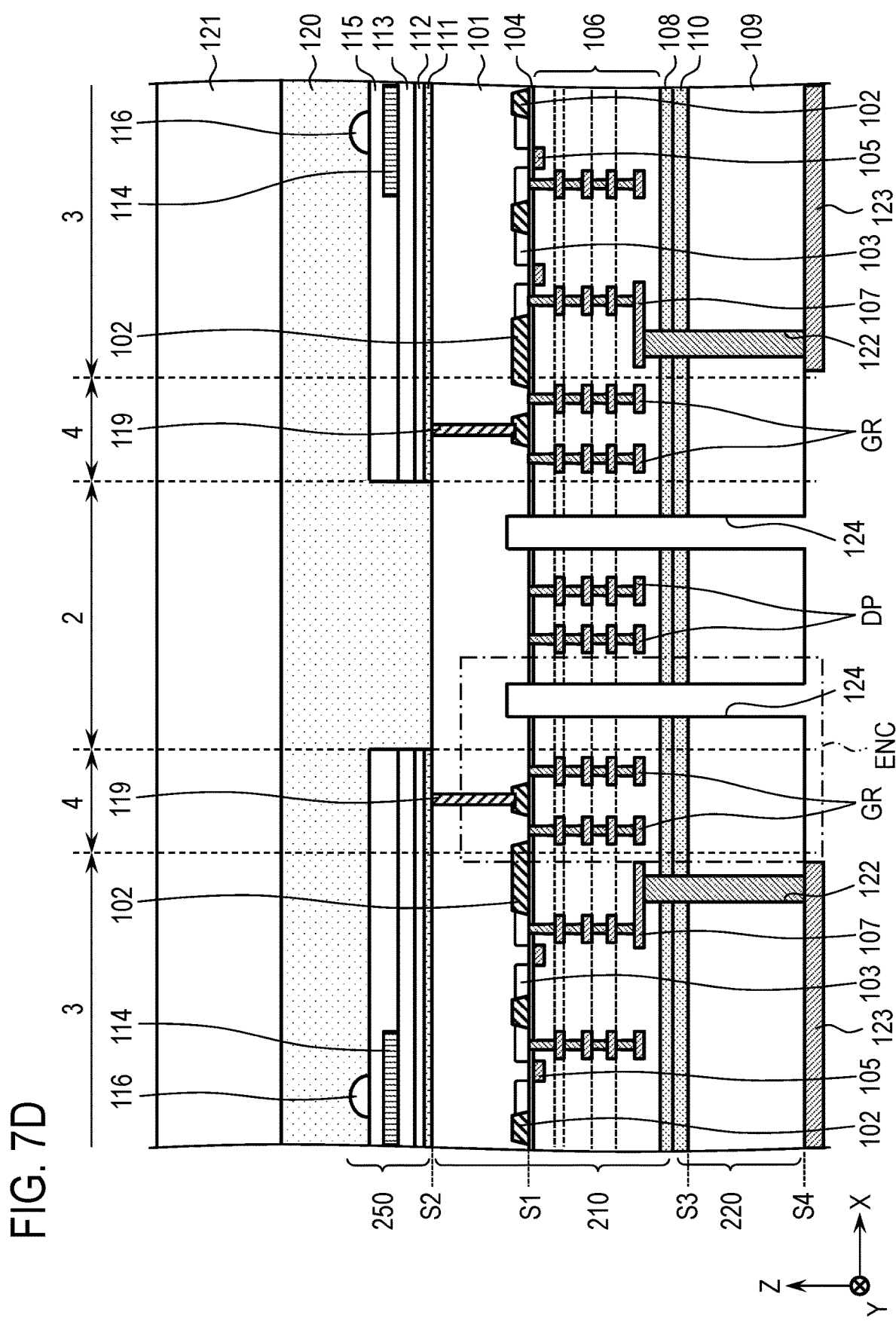

Next, by photolithography and dry etching, grooves 124 are formed in the scribe region 2 so as to penetrate the substrate 109, the bonding layers 110 and 108, the interconnection structure layer 106, and the gate insulating film 104 and reach at least the main surface S1 of the substrate 101 (FIG. 7D). The grooves 124 extend from the main surface S4 side of the substrate 101 to a position deeper than all the interconnection layers provided between the substrate 109 and the substrate 101. Each of the grooves 124 is provided so as to surround each chip region including the guard ring region 4 and the functional element region 3 while avoiding the structures such as dummy patterns DP and TEGs provided in the scribe region 2.

When the grooves 124 are formed, the substrate 109 may be removed by anisotropic etching using, for example, a Bosch process. The bonding layers 110 and 108 and the interlayer insulating films constituting the interconnection structure layer 106 and the gate insulating film 104 may be removed by anisotropic etching such as capacitively coupled-type RIE using a mixed gas containing $CF_4$, $O_2$, or the like. When the grooves 124 are formed, the grooves 124 may extend into the substrate 101 as a result. Like the etching of the substrate 109, the grooves 124 may be extended into the substrate 101 using a Bosch process.

Figure 7E:
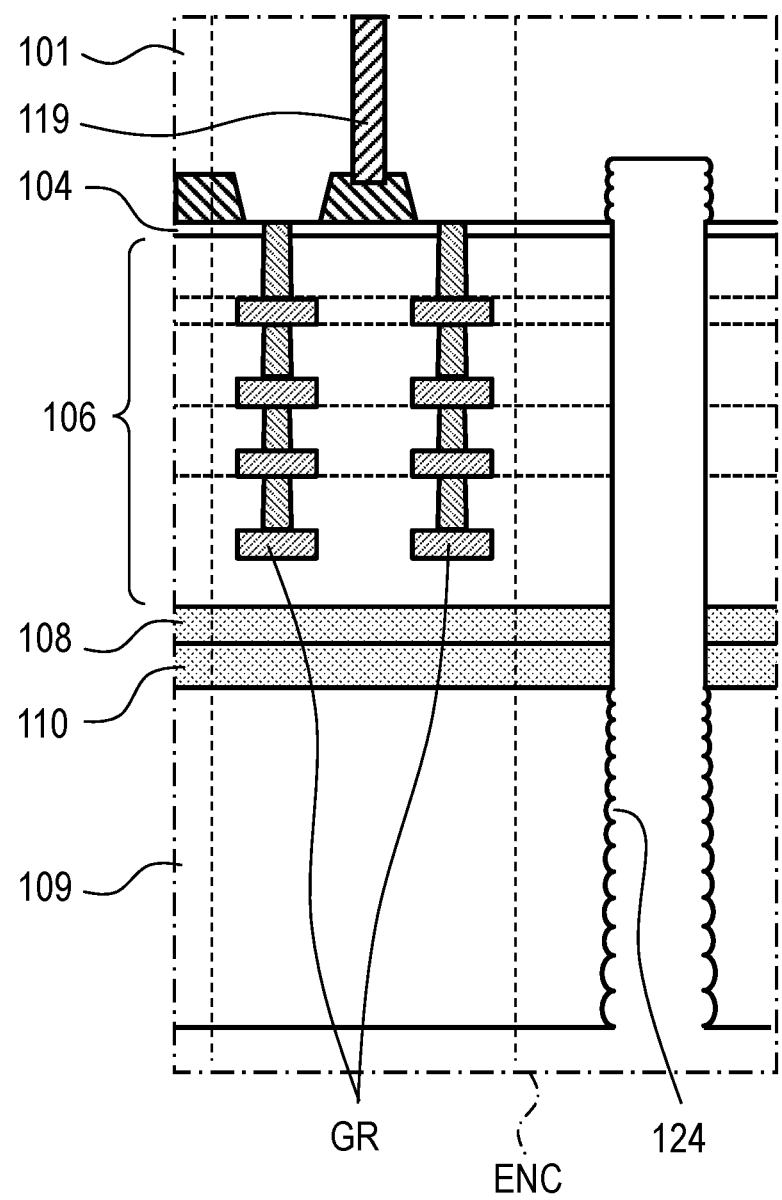

FIG. 7E is an enlarged view of the area ENC in FIG. 7D. As illustrated in FIG. 7E, the side surfaces of the groove 124 are smooth with little unevenness in the portions of the bonding layers 110 and 108, the interconnection structure layer 106, and the gate insulating film 104. On the other hand, in the portion of the substrate 109, a scallop corresponding to the number of cycles of the Bosch process is formed on the side surfaces of the groove 124. When the groove 124 is extended to the inside of the substrate 101 using the Bosch process, a scallop corresponding to the number of cycles of the Bosch process is formed on the side surfaces of the groove 124 also in the portion of the substrate 101. The scallop formed in the portions of the substrate 109 and the substrate 101 of the groove 124 becomes smaller toward the bottom portion side (the substrate 101 side) of the groove 124.

The grooves 124 may be formed at the same time as the openings 122 to the same depth as the pad electrodes 107. Thereafter, a photoresist pattern covering the openings 122 is formed, and only the grooves 124 are extended, whereby the openings 122 and the grooves 124 having different depths may be formed. When the scribe region 2 is not provided with structures such as dummy patterns DP and TEGs, the groove 124 may be continuously formed over the central portion of the scribe region 2, as in the second embodiment.

Next, solder balls or solder bumps (not illustrated) are formed on the metal interconnections 123 in the openings provided in the solder resist. The solder balls and solder bumps may be made of, for example, tin, silver, copper, nickel, bismuth, indium, lead, gold, or alloys thereof.

Next, the bonded substrate 200 is cut along the scribe region 2 in a region outside the inner side surface of the groove 124, and the bonded substrate 200 is divided into a plurality of chips (semiconductor device 1) (FIG. 7F). The inner side surface of the groove 124 is a side surface on the side of the guard ring region 4 and the functional element region 3 surrounded by the groove 124. The region outside the inner side surface of the groove 124 is a region closer to the central portion side of the scribe region 2 than the inner side surface of the groove 124. Although blade dicing may be used for cutting the bonded substrate 200, laser dicing may also be applied when structures such as dummy patterns DP and TEGs are not provided in the scribe region 2. A region where the bonded substrate 200 is cut (a region where dicing is performed) may be a region between adjacent grooves 124 in the scribe region 2, or a part of the region may overlap the groove 124.

Figure 7G:
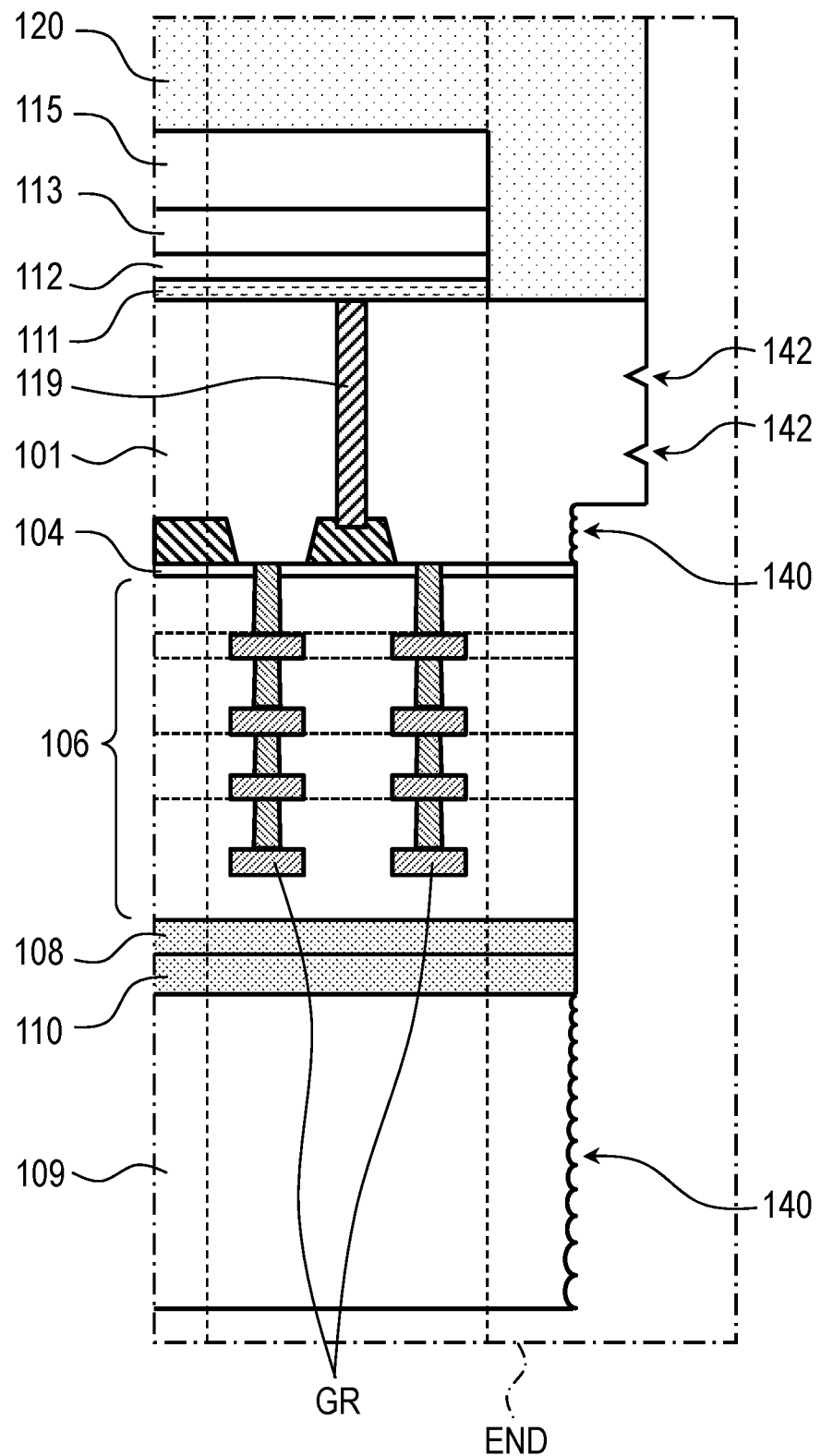

FIG. 7G is an enlarged view of the area END in FIG. 7F. The right side surface in FIG. 7G, that is, the inner side surface of the groove 124 and the cut surface obtained by the blade dicing process form the side surface of the semiconductor device 1 which has been singulated. Since a step having a height corresponding to the distance between the inner side surface of the groove 124 and the region where the blade dicing is performed exists between the inner side surface of the groove 124 and the cut surface by the blade dicing process, the step remains also on the side surface of the semiconductor device 1 after the singulation. The scallop 140 due to the Bosch process remains in a portion of the side surface of the semiconductor device 1 corresponding to the substrates 109 and 101 among the portions of the side surface of the groove 124. In the side surface of the semiconductor device 1, a chipping 142 or cracks caused by the chipping 142 may occur in the cut surface (substrate 101) by the blade dicing process.

When the bonded substrate 200 is cut in the region between the grooves 124, even if chipping occurs during dicing, cracks due to chipping or chipping may be stopped by the grooves 124. Therefore, chipping and cracks do not propagate to the guard ring GR, the functional elements in the functional element region 3, and the interconnection structure layer 106. Further, when the bonded substrate 200 is cut in the region overlapping with the groove 124, chipping and cracks do not occur in the guard ring GR, the functional elements in the functional element region 3, and the interconnection structure layer 106 by preventing the blade from contacting the inner side surface of the groove 124.

Although chipping or cracks may occur in the substrate 101 in any case, chipping or cracks may be stopped by the insulating structure 119 because the insulating structure 119 is provided in the substrate 101. Further, the insulating structure 119 may ensure a certain moisture-proof property with respect to the functional elements provided in the functional element region 3. In addition, since the optical structure layer 250 in the scribe region 2 is removed in advance, chipping or cracks do not occur in the optical structure layer 250 when the bonded substrate 200 is cut. Therefore, the function of the semiconductor device is not hindered by chipping or cracking caused by cutting of the bonded substrate 200.

A plan view of the semiconductor device 1 after singulation viewed from the main surface S4 side of the substrate 109 is the same as FIG. 5. In this case, the first portion 152 of the side surface of the stacked structure is a portion defined by the side surface of the substrate 109 and corresponds to the inner side surface of the groove 124. The second portion 154 of the stacked structure is a portion defined by the side surface of the substrate 101 and corresponds to a cut surface formed by blade dicing. In the plan view, the width W1 of the stacked structure in the portion defined by the first portion 152 is smaller than the width W2 of the stacked structure in the portion defined by the second portion 154 due to the step between the inner side surface of the groove 124 and the cut surface by the blade dicing process.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Fourth Embodiment

Figure 8A:
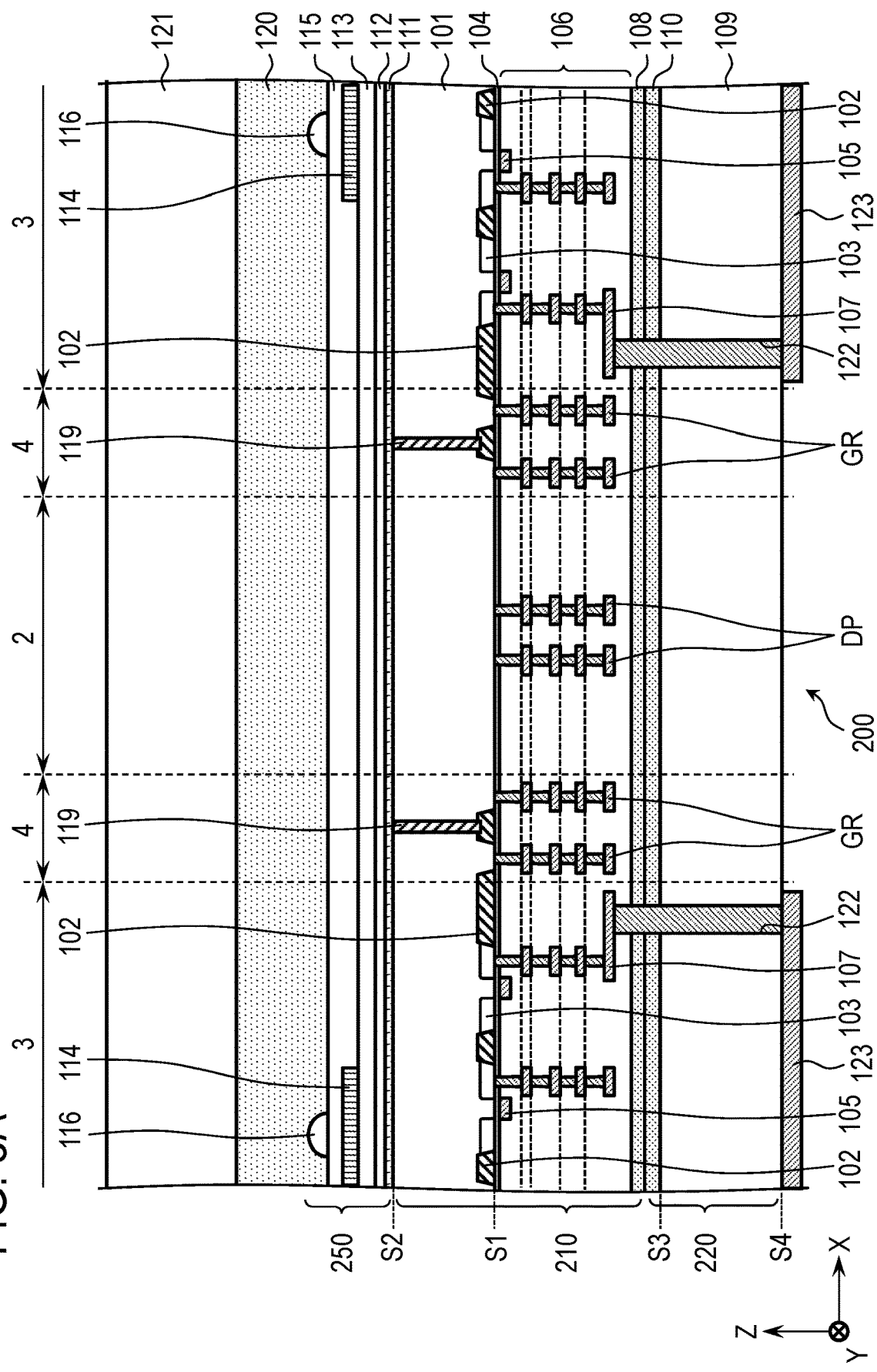
FIG. 8A, FIG. 8B, and FIG. 8C are cross-sectional views illustrating a method of manufacturing a semiconductor device according to a fourth embodiment of the present invention.
Figure 8B:
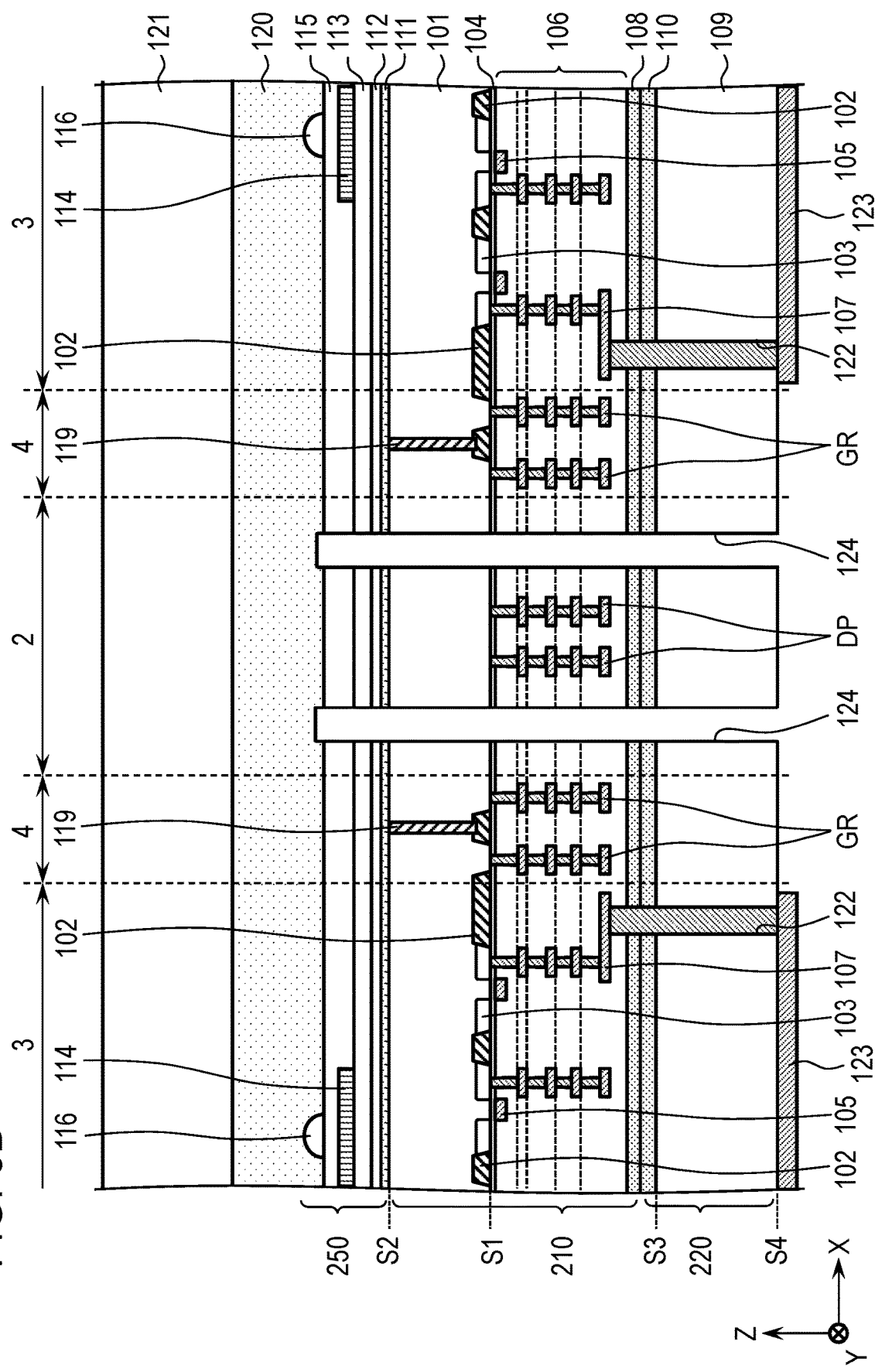
Figure 8C:
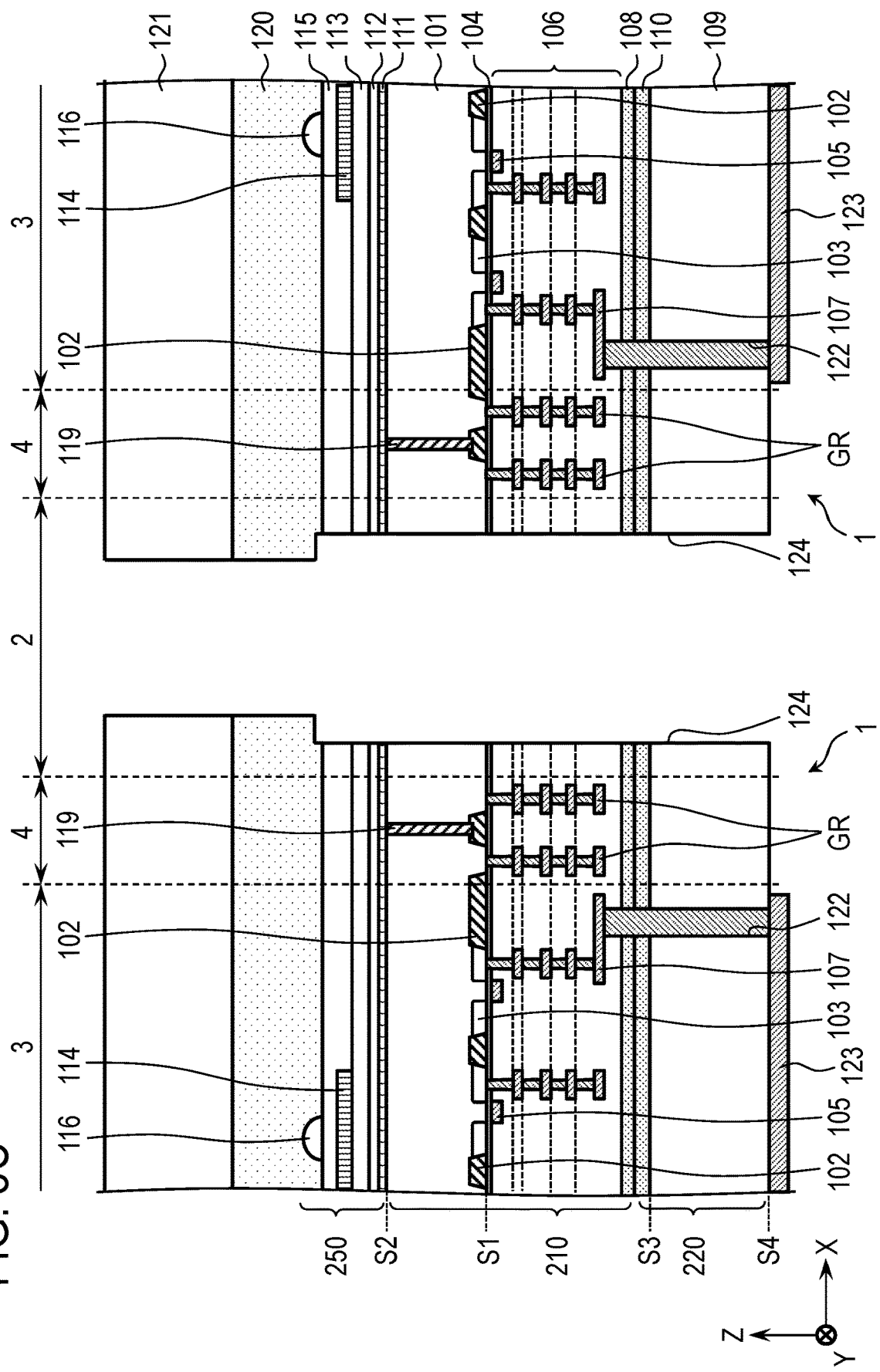

A method of manufacturing a semiconductor device according to a fourth embodiment of the present invention will be described with reference to FIG. 8A to FIG. 8C. The same components as those in the first to third embodiments are denoted by the same reference numerals, and the description thereof will be omitted or simplified. FIG. 8A to FIG. 8C are cross-sectional views illustrating the method of manufacturing the semiconductor device according to the present embodiment.

First, a bonded substrate 200 is formed in the same manner as the method of manufacturing the semiconductor device according to the third embodiment illustrated in FIG. 7A to FIG. 7C (FIG. 8A). In the present embodiment, the planarization layers 115 and 113, the insulating film 112, and the antireflection film 111 in the scribe region 2 are not removed. Other points are the same as those of the third embodiment.

Next, by photolithography and dry etching, grooves 124 are formed in the scribe region 2 so as to penetrate the second component 220, the first component 210, and the optical structure layer 250 from the main surface S4 side and reach at least the adhesive layer 120 (FIG. 8B). Each of the grooves 124 is provided so as to surround each chip region including the guard ring region 4 and the functional element region 3 while avoiding the structures such as dummy patterns DP and TEGs provided in the scribe region 2.

When the grooves 124 are formed, the substrates 109 and 101 may be removed by anisotropic etching using, for example, a Bosch process. The bonding layers 110 and 108, interlayer insulating films constituting the interconnection structure layer 106, the gate insulating film 104, the antireflection film 111, and the insulating film 112 may be removed by anisotropic etching such as capacitively coupled-type RIE using a mixed gas containing $CF_4$, $O_2$, or the like. The planarization layers 113 and 115 may be removed by anisotropic etching using a mixed gas containing $N_2$, $O_2$, or the like. When an antireflection film is further provided over the planarization layer 115, the antireflection film may be removed by anisotropic etching using a gas containing $CF_4$ or the like, for example. In forming the grooves 124, the grooves 124 may be extended into the adhesive layer 120 as a result.

Next, solder balls or solder bumps (not illustrated) are formed on the metal interconnections 123 in the openings provided in the solder resist. The solder balls and solder bumps may be made of, for example, tin, silver, copper, nickel, bismuth, indium, lead, gold, or alloys thereof.

Next, the bonded substrate 200 is cut along the scribe region 2 in a region outside the inner side surface of the groove 124, and the bonded substrate 200 is divided into a plurality of chips (semiconductor device 1) (FIG. 8C). The inner surface of the groove 124 and the cut surface obtained by the dicing process form the side surface of the individual semiconductor device 1. The generation of steps, scallops, and chipping on the side surface of the semiconductor device 1 is the same as in the third embodiment. Although blade dicing may be used for cutting the bonded substrate 200, laser dicing may also be applied when structures such as dummy patterns DP and TEGs are not provided in the scribe region 2. A region where the bonded substrate 200 is cut (a region where dicing is performed) may be a region between adjacent grooves 124 in the scribe region 2, or a part of the region may overlap the groove 124.

When the bonded substrate 200 is cut in the region between the grooves 124, even if chipping occurs during dicing, cracks due to chipping or chipping may be stopped by the grooves 124. Therefore, chipping and cracks do not propagate to the guard ring GR, the functional elements in the functional element region 3, the interconnection structure layer 106, and the optical structure layer 250. When the bonded substrate 200 is cut in the region overlapping with the groove 124, chipping or cracks do not occur in the guard ring GR, the functional elements in the functional element region 3, the interconnection structure layer 106, and the optical structure layer 250 by preventing the blade from contacting the inner side surface of the groove 124. Therefore, the function of the semiconductor device is not hindered by chipping or cracking caused by cutting of the bonded substrate 200.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Fifth Embodiment

Figure 9:
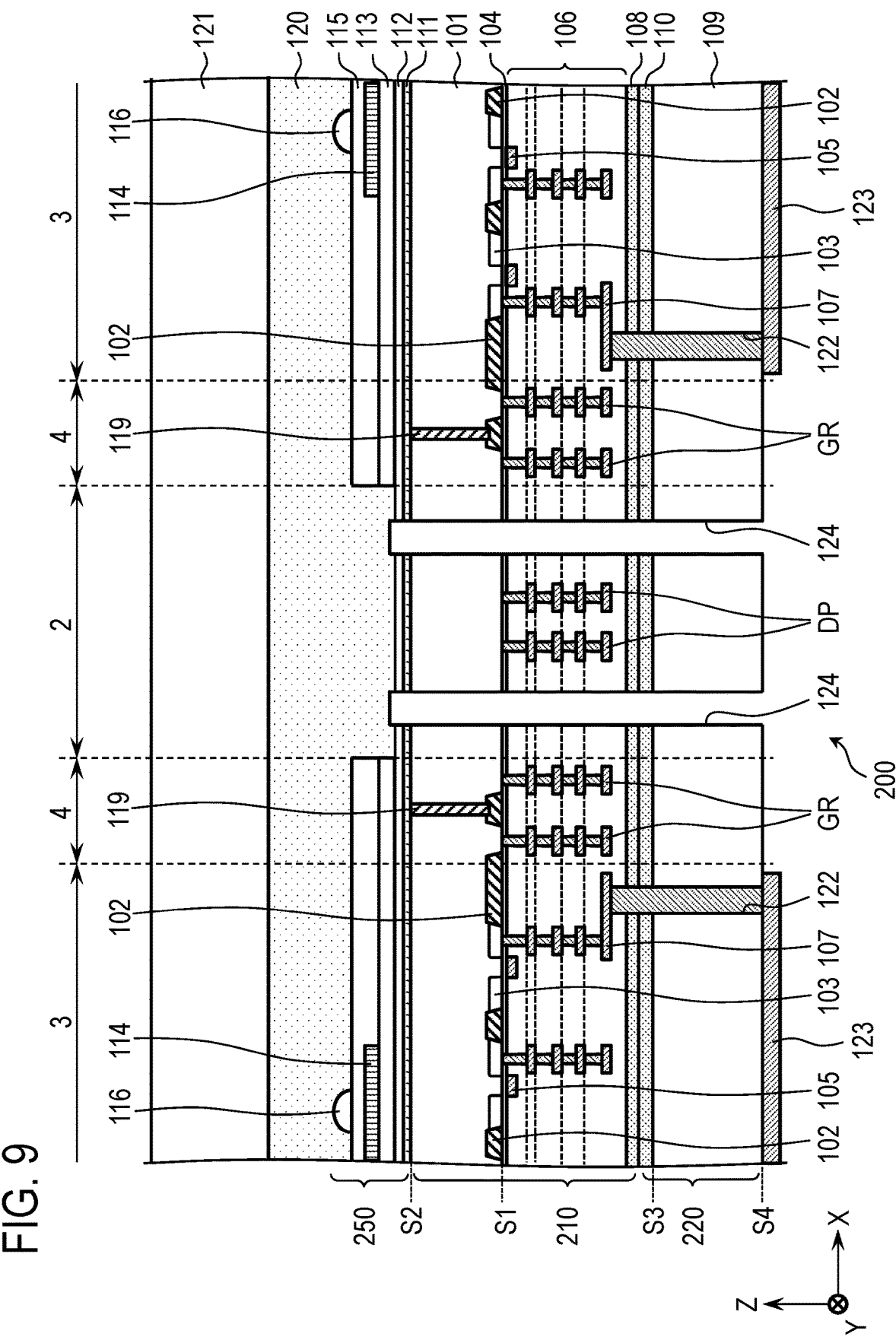
FIG. 9 is a cross-sectional view illustrating a method of manufacturing a semiconductor device according to a fifth embodiment of the present invention.

A method of manufacturing a semiconductor device according to a fifth embodiment of the present invention will be described with reference to FIG. 9. The same components as those in the first to fourth embodiments are denoted by the same reference numerals, and the description thereof will be omitted or simplified. FIG. 9 is a cross-sectional view illustrating the method of manufacturing the semiconductor device according to the present embodiment.

In the third embodiment, the antireflection film 111, the insulating film 112, and the planarization layers 113 and 115 in the scribe region 2 are removed in advance. In the fourth embodiment, the antireflection film 111, the insulating film 112, and the planarization layers 113 and 115 in the scribe region 2 are not removed, but the grooves 124 are formed so as to reach the adhesive layer 120. In contrast, in the present embodiment, as illustrated in FIG. 9, only the planarization layers 113 and 115 of the optical structure layer 250 in the scribe region 2 are removed in advance, and the grooves 124 are formed so as to reach the adhesive layer 120.

By removing the planarization layers 113 and 115 of the scribe region 2 in advance, the depth of the grooves 124 that penetrate the second component 220 and the first component 210 and reaches the adhesive layer 120 may be made shallow by an amount corresponding to the thickness of the planarization layers 113 and 115. Therefore, the thickness of the photoresist film used as a mask when forming the grooves 124 may be reduced accordingly, and processing of the grooves 124 becomes easy.

Other points are the same as those of the third or fourth embodiment.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Sixth Embodiment

Figure 10:
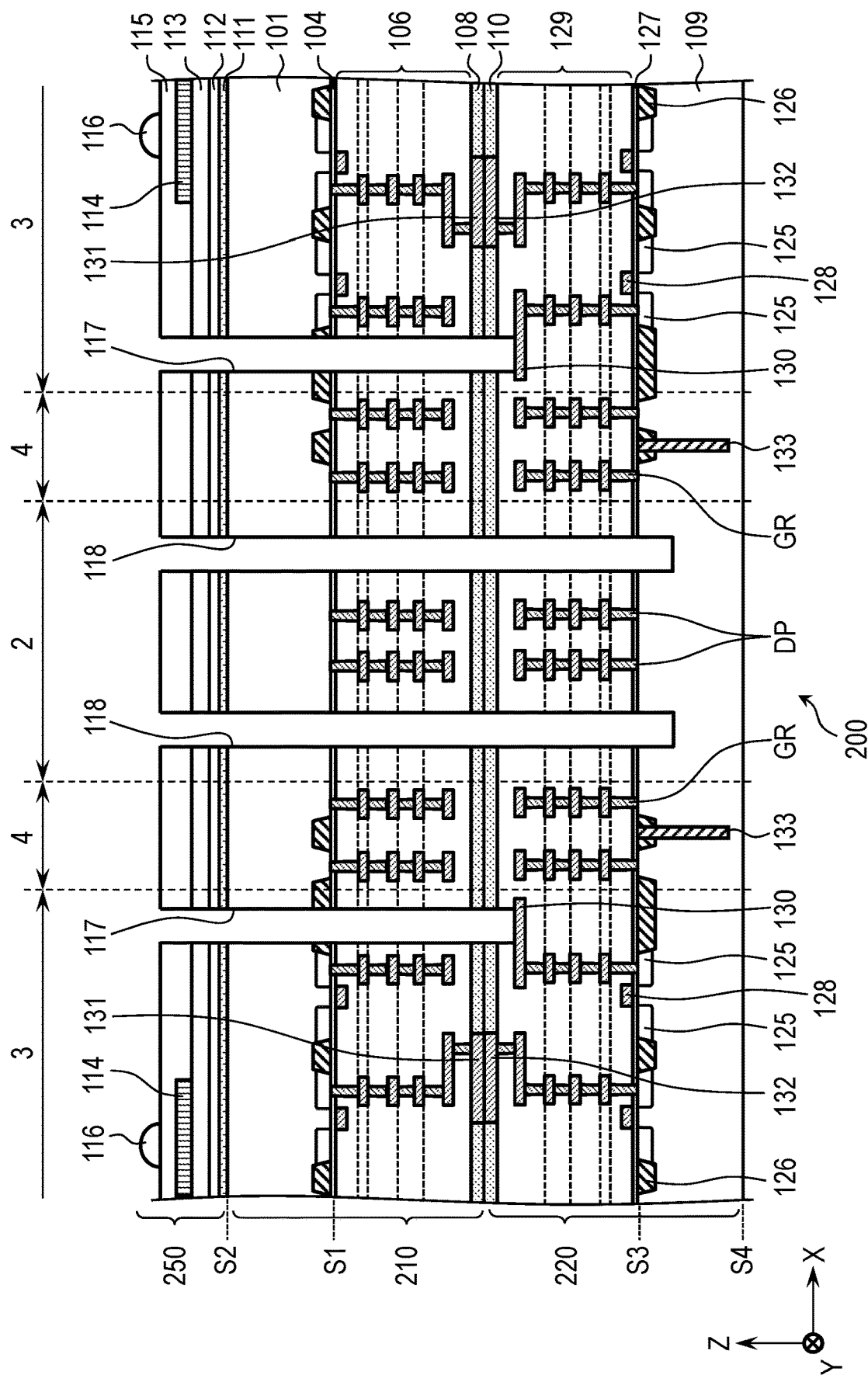
FIG. 10 is a cross-sectional view illustrating a method of manufacturing a semiconductor device according to a sixth embodiment of the present invention.

A method of manufacturing a semiconductor device according to a sixth embodiment of the present invention will be described with reference to FIG. 10. The same components as those in the first to fifth embodiments are denoted by the same reference numerals, and the description thereof will be omitted or simplified. FIG. 10 is a cross-sectional view illustrating the method of manufacturing the semiconductor device according to the present embodiment.

The bonded substrate 200 of the present embodiment differs from the bonded substrates 200 of the first and second embodiments in the structure of the second component 220. That is, as illustrated in FIG. 10, the second component in the bonded substrate 200 of the present embodiment further includes an interconnection structure layer 129 between the substrate 109 and the bonding layer 110. Like the first component 210, the second component 220 may include functional elements, a guard ring, and the like.

The substrate 109 may be a semiconductor substrate, such as a single crystalline silicon substrate. On the main surface S3 side of the substrate 109, an element isolation portion 126 and a predetermined functional elements corresponding to the function of the semiconductor device are provided. The element isolation portion 126 has, for example, an STI structure. FIG. 10 illustrates MOS transistors as an example of the functional elements. The MOS transistors include a source/drain regions 125 provided in the substrate 109, and a gate electrode 128 provided over the main surface S3 of the substrate 109 with a gate insulating film 127 interposed therebetween.

Like the functional element provided in the first component 210, the functional element provided in the second component 220 is not limited to a MOS transistor, and may include various elements according to functions required for the semiconductor device. For example, when the semiconductor device 1 has a function as an optical sensor, a photoelectric conversion unit including a photoelectric conversion element may be provided in the functional element region 3 of the first component 210, and a readout circuit for reading out a signal generated in the photoelectric conversion unit may be provided in the functional element region 3 of the second component 220. An insulating structure 133 is provided in the guard ring region 4 in the substrate 109. The insulating structure 133 may be formed of an insulating material such as silicon nitride or silicon oxide.

The interconnection structure layer 129 provided over the main surface S3 of the substrate 109 includes an insulating film and a plurality of interconnection layers arranged in the insulating film. Although FIG. 10 illustrates a multilevel interconnection structure including four interconnection layers as the interconnection structure layer 129, the number of interconnection layers constituting the interconnection structure layer 129 is not limited to four. These interconnection layers are connected to each other via contact plugs so as to form desired circuits and structures. The interconnection structure layer 129 may be manufactured by a process similar to that of the interconnection structure layer 106.

The interconnection layers constituting the interconnection structure layer 129 includes the pad electrodes 130 provided in the functional element region 3. In FIG. 10, the pad electrodes 130 are formed by the fourth-level interconnection layer most distant from the main surface S3 of the substrate 109, but the pad electrodes 130 may be formed by any interconnection layer constituting the interconnection structure layer 129.

The guard ring region 4 is provided with a guard ring GR formed of the element isolation portion 126 and the interconnection layers constituting the interconnection structure layer 129. The guard ring GR is provided so as to surround the functional element region 3, and has a function of suppressing intrusion of moisture into the functional element region 3 and damage during dicing. A TEG for evaluating and managing a process or a device, a dummy pattern used for a predetermined purpose, or the like may be provided in the central portion of the scribe region 2. Here, it is assumed that dummy patterns DP made of interconnection layers constituting the interconnection structure layer 129 are provided in the scribe region 2.

A metal bonding layer 132 made of a metal material such as copper is provided over the interconnection structure layer 129. The metal bonding layer 132 may be used for a part of interconnections, and in this case, the metal bonding layer 132 is electrically connected to the interconnection constituting the interconnection structure layer 129 via a conductive member such as a via plug. The surfaces of the bonding layer 110 and the metal bonding layer 132 on the first component 210 side are planarized.

Similarly, a metal bonding layer 131 made of a metal material such as copper is provided over the interconnection structure layer 106 of the first component 210. In this case, the metal bonding layer 131 is electrically connected to the interconnection constituting the interconnection structure layer 106 via a conductive member such as a via plug. The surfaces of the bonding layer 108 and the metal bonding layer 131 on the side of the second component 220 are planarized.

When the first component 210 and the second component 220 are bonded together so that the metal bonding layer 131 of the first component 210 and the metal bonding layer 132 of the second component 220 are in contact with each other, the metal bonding layer 131 and the metal bonding layer 132 are strongly bonded together by the metal bonding. When the metal bonding layers 131 and 132 constitute a part of the interconnection, the metal bonding layers 131 and 132 may serve as electrical paths for connecting the functional elements provided in the first component 210 and the functional elements provided in the second component 220.

The openings 117 are formed so as to penetrate the optical structure layer 250, the first component 210, the bonding layer 110, and a part of the interconnection structure layer 129 and reach the pad electrodes 130. The grooves 118 are formed so as to penetrate the optical structure layer 250, the first component 210, the bonding layer 110, the interconnection structure layer 129, and the gate insulating film 127 and reach at least the main surface S3 of the substrate 109. When structures such as dummy patterns DP and TEGs are provided in the scribe region 2, the grooves 118 may be provided so as to surround each chip region including the guard ring region 4 and the functional element region 3 while avoiding the structure. When structures such as dummy patterns DP and TEGs are not provided in the scribe region 2, a continuous grooves 118 may be formed over the central portion of the scribe region 2, as in the second embodiment.

Like the interlayer insulating film constituting the interconnection structure layer 106, the interlayer insulating film constituting the interconnection structure layer 129 may be removed by anisotropic etching such as capacitively coupled-type RIE using a mixed gas containing $CF_4$, $O_2$, or the like. When the grooves 118 are formed, the grooves 118 may extend into the substrate 109 as a result.

The grooves 118 may be opened at the same time as the openings 117 to the same depth as the pad electrodes 130, and then a photoresist pattern covering the openings 117 may be formed to extend only the grooves 118.

The bonded substrate 200 is cut along the scribe region 2 in a region outside the inner side surface of the groove 118, and is divided into a plurality of chips (semiconductor device 1). The inner surface of the groove 118 and the cut surface obtained by the dicing process form the side surface of the individual semiconductor device 1. The generation of steps, scallops, and chipping on the side surfaces of the semiconductor device 1 is the same as in the first embodiment. Although blade dicing may be used for cutting the bonded substrate 200, laser dicing may also be applied when structures such as dummy patterns DP and TEGs are not provided in the scribe region 2. A region where the bonded substrate 200 is cut (a region where dicing is performed) may be a region between adjacent grooves 118 in the scribe region 2, or a part of the region may overlap the groove 118.

When the bonded substrate 200 is cut in the region between the groove 118, even if chipping occurs during dicing, cracks due to chipping or chipping may be stopped by the grooves 118. Therefore, chipping and cracks do not propagate to the guard ring GR, the functional elements in the functional element region 3, and the interconnection structure layers 106 and 129. Further, when the bonded substrate 200 is cut in the region overlapping with the groove 118, chipping or cracking does not occur in the guard ring GR, the functional element of the functional element region 3, and the interconnection structure layers 106 and 129 by preventing the blade from contacting the inner surface of the groove 118.

In either case, chipping or cracks may occur in the substrate 109, but since the insulating structure 133 is provided in the substrate 109, chipping or cracks may be stopped by the insulating structure 133. Therefore, the function of the semiconductor device is not hindered by chipping or cracking caused by cutting of the bonded substrate 200. Further, the insulating structure 133 may ensure a certain moisture-proof property with respect to the functional element provided in the functional element region 3.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Seventh Embodiment

Figure 11:
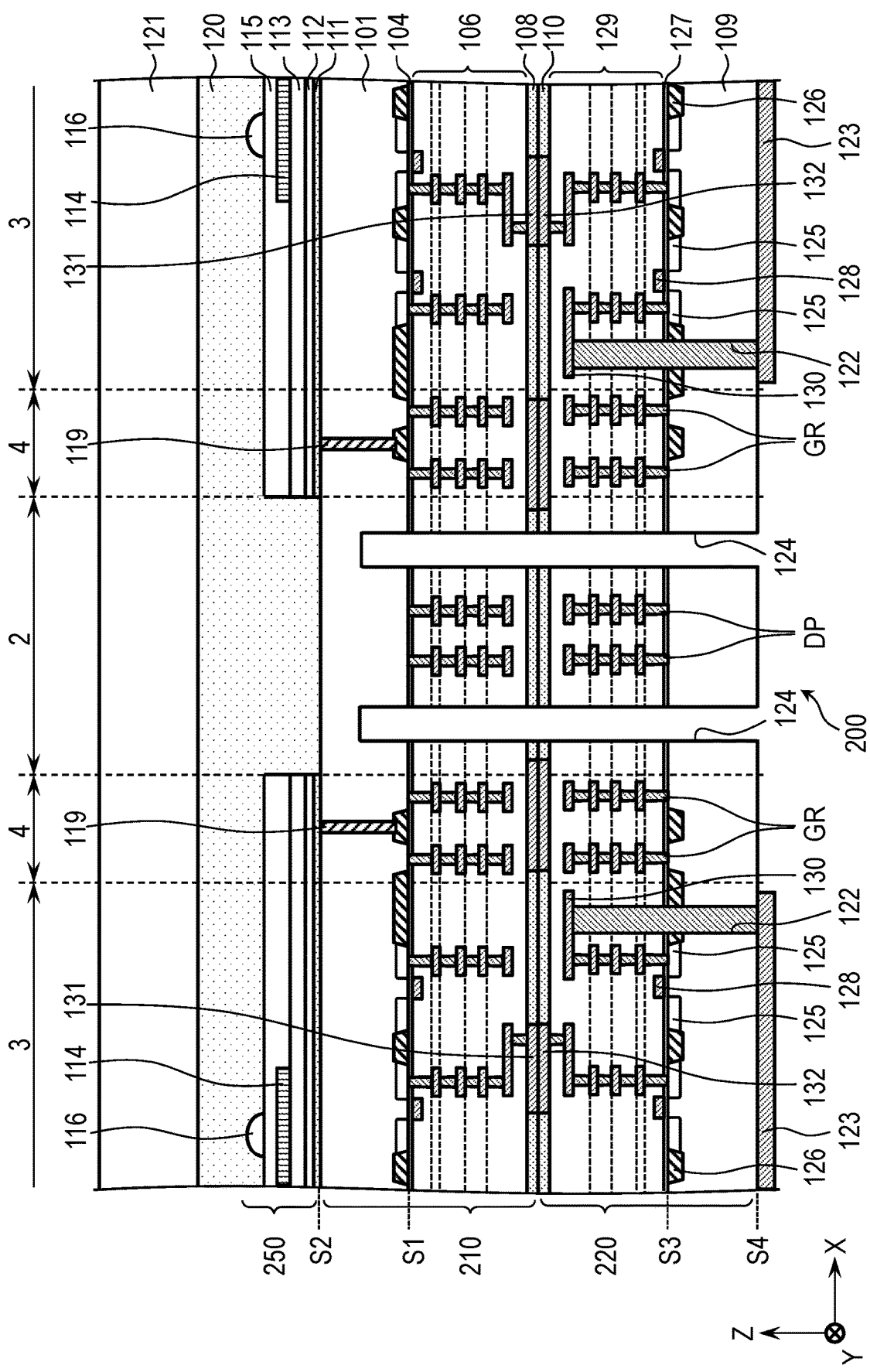
FIG. 11 is a cross-sectional view illustrating a method of manufacturing a semiconductor device according to a seventh embodiment of the present invention.

A method of manufacturing a semiconductor device according to a seventh embodiment of the present invention will be described with reference to FIG. 11. The same components as those in the first to sixth embodiments are denoted by the same reference numerals, and the description thereof will be omitted or simplified. FIG. 11 is a cross-sectional view illustrating the method of manufacturing the semiconductor device according to the present embodiment.

The bonded substrate 200 of the present embodiment is an application example to WLSCP similar to those of the third to fifth embodiments, but the structure of the second component 220 is different from those of the bonded substrates 200 of the third to fifth embodiments. That is, as illustrated in FIG. 11, the second component in the bonded substrate 200 of the present embodiment further includes an interconnection structure layer 129 between the substrate 109 and the bonding layer 110. Other points of the bonded substrate 200 of the present embodiment are the same as those of the third embodiment. Like the first component 210, the second component 220 may include functional elements, a guard ring, and the like. The basic structure of the second component 220 and the manner of joining the second component 220 and the first component 210 are the same as those in the sixth embodiment.

The openings 122 are formed so as to penetrate the substrate 109, the gate insulating film 127, and a part of the interconnection structure layer 129 and reach the pad electrodes 130. The grooves 124 are formed so as to penetrate the second component 220, the bonding layer 108, the interconnection structure layer 106, and the gate insulating film 104 and reach at least the main surface S1 of the substrate 101. The interlayer insulating films constituting the interconnection structure layer 129 and the gate insulating film 127 may be removed by anisotropic etching such as capacitively coupled-type RIE using a mixed gas containing $CF_4$, $O_2$, or the like, similarly to the interlayer insulating film constituting the interconnection structure layer 106. The openings 122 are not necessarily formed so as to reach the pad electrodes 130 included in the interconnection structure layer 129, and may be formed so as to reach the pad electrodes (not illustrated) included in the interconnection structure layer 106. These pad electrodes may be provided in any interconnection layer of the interconnection structure layers 106 and 129.

The grooves 124 may be opened at the same time as the openings 122 up to the same depth as the pad electrodes 130, and then a photoresist pattern covering the openings 122 may be formed to extend only the grooves 124. When the scribe region 2 is not provided with structures such as dummy patterns DP and TEGs, the grooves 124 may be continuously formed over the central portion of the scribe region 2, as in the second embodiment.

The bonded substrate 200 is cut along the scribe region 2 in a region outside the inner side surface of the groove 124, and is divided into a plurality of chips (semiconductor device 1). The inner surface of the groove 124 and the cut surface obtained by the dicing process form the side surface of the individual semiconductor device 1. The generation of steps, scallops, and chipping on the side surfaces of the semiconductor device 1 is the same as in the third embodiment. Although blade dicing may be used for cutting the bonded substrate 200, laser dicing may also be applied when structures such as dummy patterns DP and TEGs are not provided in the scribe region 2. A region where the bonded substrate 200 is cut (a region where dicing is performed) may be a region between adjacent grooves 124 in the scribe region 2, or a part of the region may overlap the groove 124.

When the bonded substrate 200 is cut in the region between the grooves 124, even if chipping occurs during dicing, cracks due to chipping or chipping may be stopped by the grooves 124. Therefore, chipping and cracks do not propagate to the guard ring GR, the functional elements in the functional element region 3, and the interconnection structure layers 106 and 129. Further, when the bonded substrate 200 is cut in the region overlapping with the groove 124, chipping or cracking does not occur in the guard ring GR, the functional elements in the functional element region 3, and the interconnection structure layers 106 and 129 by preventing the blade from contacting the inner side surface of the groove 124.

Although chipping or cracks may occur in the substrate 101 in any case, chipping or cracks may be stopped by the insulating structure 119 because the insulating structure 119 is provided in the substrate 101. Further, the insulating structure 119 may ensure a certain moisture-proof property with respect to the functional element provided in the functional element region 3. In addition, since the optical structure layer 250 in the scribe region 2 is removed in advance, chipping or cracks do not occur in the optical structure layer 250 when the bonded substrate 200 is cut. Therefore, the function of the semiconductor device is not hindered by chipping or cracking caused by cutting of the bonded substrate 200.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Although the optical structure layer 250 of the scribe region 2 is removed in advance in the present embodiment, as described in the fourth embodiment, the grooves 124 reaching the adhesive layer 120 may be formed without removing the optical structure layer 250 of the scribe region 2. Alternatively, as described in the fifth embodiment, the planarization layers 113 and 115 of the scribe region 2 may be removed in advance to form the grooves 124 reaching the adhesive layer 120.

Eighth Embodiment

Figure 12:
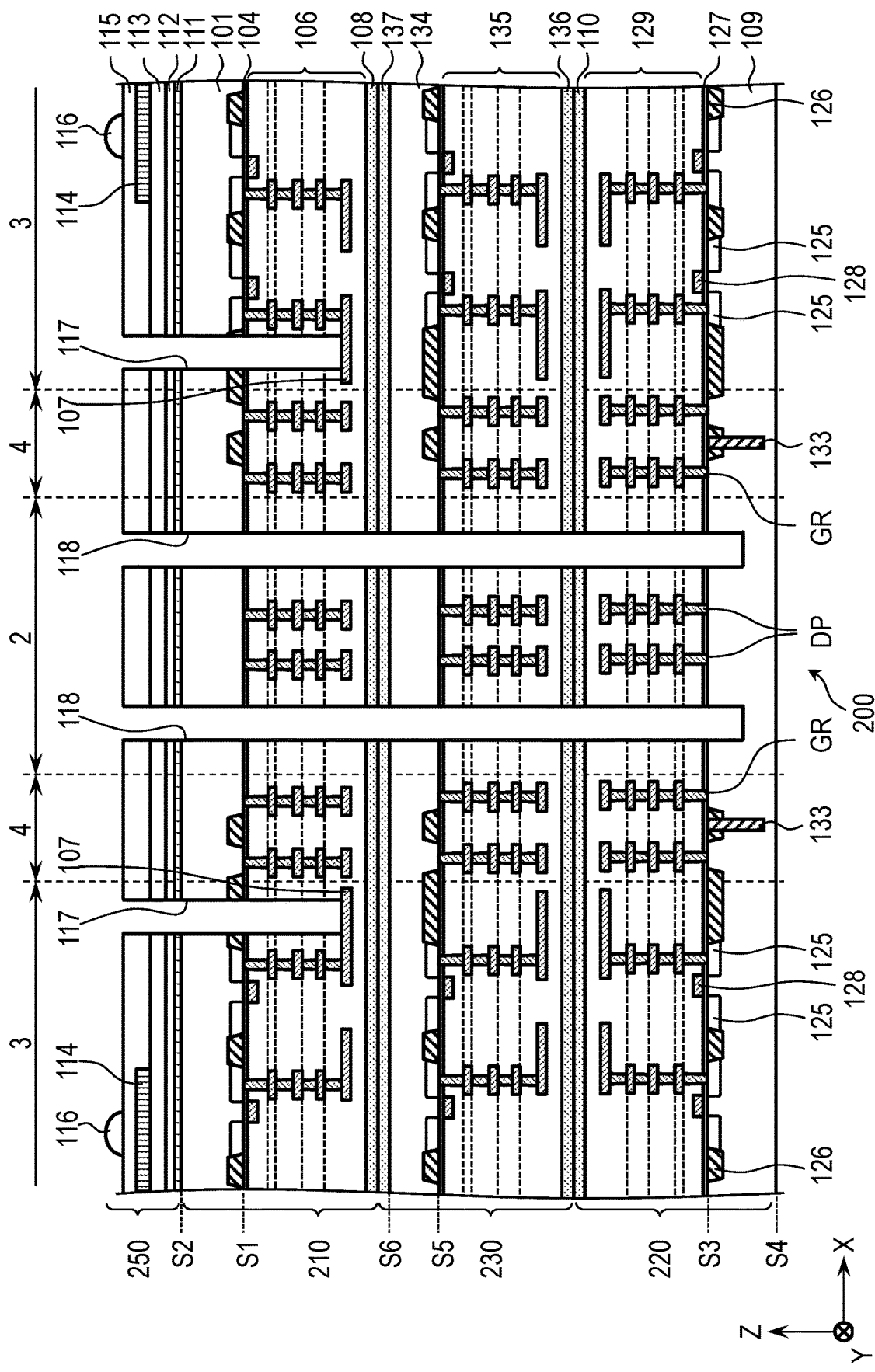
FIG. 12 is a cross-sectional view illustrating a method of manufacturing a semiconductor device according to an eighth embodiment of the present invention.

A method of manufacturing a semiconductor device according to an eighth embodiment of the present invention will be described with reference to FIG. 12. The same components as those in the first to seventh embodiments are denoted by the same reference numerals, and the description thereof will be omitted or simplified. FIG. 12 is a cross-sectional view illustrating the method of manufacturing the semiconductor device according to the present embodiment.

As illustrated in FIG. 12, the bonded substrate 200 of the present embodiment further includes a third component 230 including a substrate 134 in addition to the first component 210 including the substrate 101 and the second component 220 including the substrate 109. The third component 230 includes a substrate 134 having a main surface S5 and a main surface S6, a bonding layer 136 provided on the main surface S5 side of the substrate 134, an interconnection structure layer 135 disposed between the main surface S5 and the bonding layer 136, and a bonding layer 137 provided on the main surface S6 side of the substrate 134. Like the first component 210 and the second component 220, the substrate 134 and the interconnection structure layer 135 may include element isolation portions, functional elements, guard rings, dummy patterns, and the like.

The third component 230 is disposed between the first component 210 and the second component 220. The first component 210 and the third component 230 are arranged such that the bonding layer 108 and the bonding layer 137 face each other, and are bonded to each other by the bonding layers 108 and 137. The second component 220 and the third component 230 are arranged such that the bonding layer 110 and the bonding layer 136 face each other, and are bonded to each other by the bonding layers 110 and 136. The third component 230 may be bonded such that the bonding layer 136 and the bonding layer 108 face each other and the bonding layer 137 and the bonding layer 110 face each other.

Like the functional elements provided in the first component 210 and the second component 220, the functional elements provided in the third component 230 are not limited to MOS transistors, and may include various elements according to functions required for the semiconductor device. For example, when the semiconductor device 1 has a function as an optical sensor, a photoelectric conversion unit including a photoelectric conversion element may be provided in the functional element region 3 of the first component 210, and a readout circuit for reading out a signal generated by the photoelectric conversion unit may be provided in the functional element region 3 of the second component 220. The third component 230 may be provided with a memory element or the like for holding a signal or the like read out from the photoelectric conversion unit. Alternatively, when the semiconductor device 1 has a function as a storage device, a memory element may be provided in each of the first component 210, the second component 220, and the third component 230.

The functional elements of the first component 210 and the functional elements of the third component 230 may be electrically connected through, for example, a through via connected to the interconnection layer of the first component 210, a through via connected to the interconnection layer of the second component 220, and an interconnection connecting the through vias. In this case, the through via connected to the interconnection layer of the first component 210 may be provided so as to penetrate the substrate 101 from the main surface S2 side of the substrate 101 and be connected to an arbitrary interconnection layer of the interconnection structure layer 106. The through via connected to the interconnection layer of the third component 230 may be provided so as to penetrate the first component 210 and the substrate 134 from the main surface S2 side of the substrate 101 and be connected to any interconnection layer of the interconnection structure layer 135. The interconnection connecting these through vias may be disposed, for example, between the insulating film 112 and the planarization layer 113. The through via may be formed from the main surface S4 side of the substrate 109.

The functional elements of the second component 220 and the functional elements of the third component 230 may be electrically connected to each other using a through via as in the case of the functional elements of the first component 210 and the functional elements of the third component 230. Alternatively, a metal bonding layer may be provided at a bonding portion between the second component 220 and the third component 230, and the functional elements provided in the second component 220 and the third component 230 may be electrically connected to each other. Alternatively, the functional elements of the first component 210 and the functional elements of the second component 220 may be electrically connected via through vias.

The functional elements of the first component 210, the functional elements of the second component 220, and the functional elements of the third component 230 may be electrically connected to the pad electrodes. In the example of FIG. 12, the pad electrodes 107 are provided in the interconnection layer closest to the main surface S1 of the interconnection structure layer 106, but the pad electrodes 107 are not necessarily provided in this interconnection layer. The pad electrodes 107 are not necessarily provided in the interconnection layer constituting the interconnection structure layer 106, and may be provided in the interconnection layer constituting the interconnection structure layer 129 or the interconnection layer constituting the interconnection structure layer 135.

The openings 117 are formed so as to penetrate the optical structure layer 250, the substrate 101, the gate insulating film 104, and a part of the interconnection structure layer 106 and reach the pad electrodes 107. The grooves 118 is formed so as to penetrate the optical structure layer 250, the first component 210, the third component 230, the bonding layer 110, the interconnection structure layer 129, and the gate insulating film 127 and reach at least the main surface S3 of the substrate 109. When structures such as dummy patterns DP and TEGs are provided in the scribe region 2, the grooves 118 may be provided so as to surround each chip region including the guard ring region 4 and the functional element region 3 while avoiding the structure. When structures such as dummy patterns DP and TEGs are not provided in the scribe region 2, a continuous groove 118 may be formed over the central portion of the scribe region 2, as in the second embodiment.

The interlayer insulating film constituting the interconnection structure layer 135 may be removed by anisotropic etching such as capacitively coupled-type RIE using a mixed gas containing $CF_4$, $O_2$, or the like, similarly to the interlayer insulating films constituting the interconnection structure layers 106 and 129. Like the substrate 101, the substrate 134 may be removed by anisotropic etching using, for example, a Bosch process. When the grooves 118 are formed, the grooves 118 may extend into the substrate 109 as a result.

The bonded substrate 200 is cut along the scribe region 2 in a region outside the inner side surface of the groove 118, and is divided into a plurality of chips (semiconductor device 1). The inner surface of the groove 118 and the cut surface obtained by the dicing process form a side surface of the individual semiconductor device 1. The generation of steps, scallops, and chipping on the side surfaces of the semiconductor device 1 is the same as in the first embodiment. Although blade dicing may be used for cutting the bonded substrate 200, laser dicing may also be applied when structures such as dummy patterns DP and TEGs are not provided in the scribe region 2. A region where the bonded substrate 200 is cut (a region where dicing is performed) may be a region between adjacent grooves 118 in the scribe region 2, or a part of the region may overlap the groove 118.

When the bonded substrate 200 is cut in the region between the grooves 118, even if chipping occurs during dicing, cracks due to chipping or chipping may be stopped by the grooves 118. Therefore, chipping and cracks do not propagate to the guard ring GR, the functional elements in the functional element region 3, and the interconnection structure layers 106, 129, and 135. Further, when the bonded substrate 200 is cut in the region overlapping with the grooves 118, by preventing the blade from contacting the inner side surface of the groove 118, chipping or cracks do not occur in the guard ring GR, the functional elements in the functional element region 3, and the interconnection structure layers 106, 129, and 135.

In either case, chipping or cracks may occur in the substrate 109, but since the insulating structure 133 is provided in the substrate 109, chipping or cracks may be stopped by the insulating structure 133. Therefore, the function of the semiconductor device is not hindered by chipping or cracking caused by cutting of the bonded substrate 200. Further, the insulating structure 133 may ensure a certain moisture-proof property with respect to the functional element provided in the functional element region 3.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Ninth Embodiment

Figure 13:
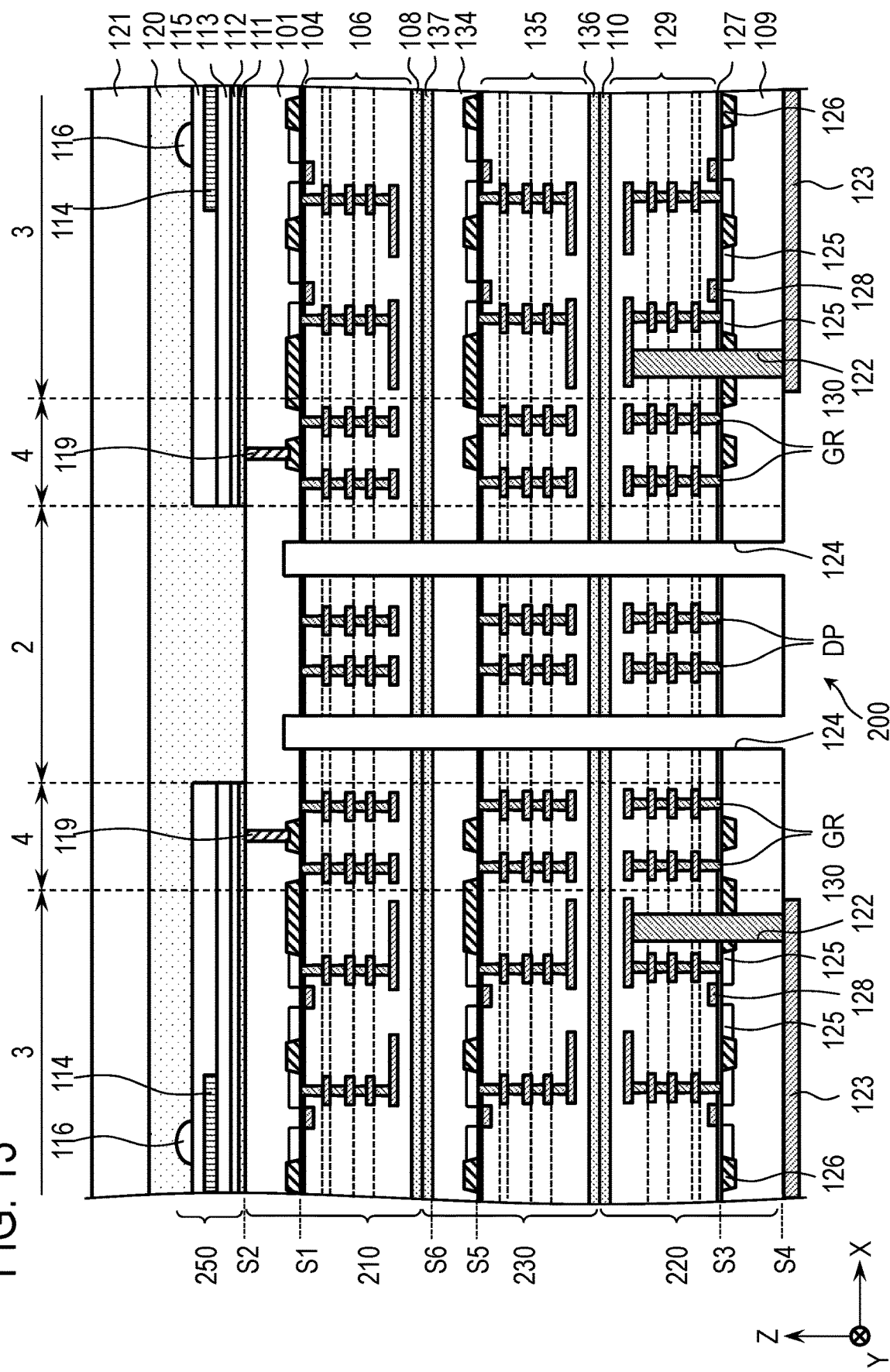
FIG. 13 is a cross-sectional view illustrating a method of manufacturing a semiconductor device according to a ninth embodiment of the present invention.

A method of manufacturing a semiconductor device according to a ninth embodiment of the present invention will be described with reference to FIG. 13. The same components as those in the first to eighth embodiments are denoted by the same reference numerals, and the description thereof will be omitted or simplified. FIG. 13 is a cross-sectional view illustrating the method of manufacturing the semiconductor device according to the present embodiment.

In addition to the configuration of the seventh embodiment, the bonded substrate 200 of the present embodiment further includes a third component 230 provided between the first component 210 and the second component 220. The configuration of the third component 230 is the same as that of the third component 230 in the eighth embodiment. Other points are the same as those of the seventh embodiment.

The openings 122 is formed so as to penetrate the substrate 109, the gate insulating film 127, and a part of the interconnection structure layer 129 and reach the pad electrodes 130. In the example of FIG. 13, the pad electrodes 130 are provided in the interconnection layer closest to the main surface S3 of the interconnection structure layer 129, but the pad electrodes 130 are not necessarily provided in this interconnection layer. The pad electrodes 130 are not necessarily provided in the interconnection layer constituting the interconnection structure layer 129, and may be provided in the interconnection layer constituting the interconnection structure layer 106 or the interconnection layer constituting the interconnection structure layer 135.

The grooves 124 are formed so as to penetrate the second component 220, the third component 230, the bonding layer 108, the interconnection structure layer 106, and the gate insulating film 104 and reach at least the main surface S1 of the substrate 101. When structures such as dummy patterns DP and TEGs are provided in the scribe region 2, the grooves 124 may be provided so as to surround each chip region including the guard ring region 4 and the functional element region 3 while avoiding the structure. When structures such as dummy patterns DP and TEGs are not provided in the scribe region 2, a continuous groove 124 may be formed over the central portion of the scribe region 2, as in the second embodiment.

The interlayer insulating film constituting the interconnection structure layer 135 may be removed by anisotropic etching such as capacitively coupled-type RIE using a mixed gas containing $CF_4$, $O_2$, or the like, similarly to the interlayer insulating films constituting the interconnection structure layers 106 and 129. Like the substrate 109, the substrate 134 may be removed by anisotropic etching using, for example, a Bosch process. When the grooves 124 are formed, the grooves 124 may extend into the substrate 101 as a result.

The bonded substrate 200 is cut along the scribe region 2 in a region outside the inner side surface of the groove 124, and the bonded substrate 200 is divided into a plurality of chips (semiconductor device 1). The inner surface of the groove 124 and the cut surface obtained by the dicing process form a side surface of the individual semiconductor device 1. The generation of steps, scallops, and chipping on the side surfaces of the semiconductor device 1 is the same as in the third embodiment. Although blade dicing may be used for cutting the bonded substrate 200, laser dicing may also be applied when structures such as dummy patterns DP and TEGs are not provided in the scribe region 2. A region where the bonded substrate 200 is cut (a region where dicing is performed) may be a region between adjacent grooves 124 in the scribe region 2, or a part of the region may overlap the groove 124.

When the bonded substrate 200 is cut in the region between the grooves 124, even if chipping occurs during dicing, cracks due to chipping or chipping may be stopped by the grooves 124. Therefore, chipping and cracks do not propagate to the guard ring GR, the functional elements in the functional element region 3, and the interconnection structure layers 106, 129, and 135. When the bonded substrate 200 is cut in the region overlapping with the grooves 124, chipping or cracks do not occur in the guard ring GR, the functional element of the functional element region 3, and the interconnection structure layers 106, 129, and 135 by preventing the blade from contacting the inner side surface of the groove 124.

Although chipping or cracks may occur in the substrate 101 in any case, chipping or cracks may be stopped by the insulating structure 119 because the insulating structure 119 is provided in the substrate 101. Further, the insulating structure 119 may ensure a certain moisture-proof property with respect to the functional element provided in the functional element region 3. In addition, since the optical structure layer 250 in the scribe region 2 is removed in advance, chipping or cracks do not occur in the optical structure layer 250 when the bonded substrate 200 is cut. Therefore, the function of the semiconductor device is not hindered by chipping or cracking caused by cutting of the bonded substrate 200.

As described above, according to the present embodiment, in the method of manufacturing a semiconductor device including the step of dicing the substrate into individual pieces, it is possible to suppress the occurrence of cracks inside the semiconductor device without increasing the outer size of the semiconductor device.

Although the optical structure layer 250 of the scribe region 2 is removed in advance in the present embodiment, as described in the fourth embodiment, the grooves 124 reaching the adhesive layer 120 may be formed without removing the optical structure layer 250 of the scribe region 2. Alternatively, as described in the fifth embodiment, the planarization layers 113 and 115 of the scribe region 2 may be removed in advance to form the grooves 124 reaching the adhesive layer 120.

Modified Embodiments

The present invention is not limited to the above embodiments, and various modifications are possible.

For example, an example in which a configuration of a part of any embodiment is added to another embodiment or an example in which a configuration of a part of another embodiment is substituted is also an embodiment of the present invention.

In the above-described embodiment, the grooves 118 or 124 are formed in a frame-like pattern surrounding the guard ring region 4 and the functional element region 3 in a plan view, but the grooves 118 and 124 do not necessarily have to be continuous frame-like patterns, and may be partially interrupted.

The semiconductor device described in the above embodiments may be manufactured by bonding the lens substrate and the bonded substrate 200 using a technique called wafer level optics, and then cutting them into individual pieces. The wafer level optics is a technique in which a plurality of wafers including a wafer (lens substrate) on which a large number of lenses made of a resin material are formed are stacked and bonded together, and then cut into individual devices. By manufacturing a device in which a lens and a solid-state imaging device are combined using wafer level optics, a smaller device may be manufactured at low cost.

The functions of the semiconductor device described in the above embodiments are not particularly limited, and may be applied to various semiconductor devices such as a logic device, a memory device, and an imaging device. The semiconductor device described in the above embodiments may be applied to various electronic equipment. The electronic equipment is not particularly limited, and examples thereof include a digital still camera, a video camera, a smartphone, a personal computer, and a home electric appliance (IoT).

The semiconductor device described in the above embodiments may also be applied to a transportation equipment provided with a moving device. For example, the transport equipment may include a control device that controls the moving device based on a signal output from the semiconductor device described in the above embodiments. For example, in the case where the semiconductor device is a solid-state imaging device, the moving device may be configured to calculate a distance or the like to an object based on a signal output from the photoelectric conversion element and control the mobile device based on the calculated distance or the like. The moving device is not particularly limited, and examples thereof include a power source such as an engine, a motor, a wheel, and a propeller, and a propulsion mechanism. The transport equipment is not particularly limited, and examples thereof include an airplane, a vehicle, and a ship.

These equipment may include the semiconductor device described in the above embodiments and a signal processing device for processing a signal output from the semiconductor device.

It should be noted that all of the above-described embodiments are merely specific examples for carrying out the present invention, and the technical scope of the present invention should not be construed as being limited thereto. That is, the present invention can be implemented in various forms without departing from the technical idea thereof or the main characteristics thereof. The disclosure of this specification includes not only those described in this specification but also all matters that can be grasped from this specification and the drawings appended hereto. Also, the disclosure herein includes a complement of the concepts described herein. That is, for example, when a description that "A is larger than B" is included in this specification, even if a description that "A is not larger than B" is omitted, this specification discloses that "A is not larger than B". This is because, when "A is larger than B" is described, it is assumed that "A is not larger than B" is considered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-105541, filed Jun. 25, 2021 and Japanese Patent Application No. 2022-041120, filed Mar. 16, 2022 which are hereby incorporated by reference herein in their entirety.

What is claimed is:

1. A method of manufacturing a semiconductor device comprising:
singulating a bonded substrate formed by bonding a first substrate having a first main surface and a second main surface and provided with a first interconnection structure layer and a first bonding layer on a side of the first main surface in this order and a second substrate having a third main surface and a fourth main surface and provided with a second bonding layer on a side of the third main surface so that the first bonding layer and the second bonding layer face each other into a plurality of semiconductor devices,
wherein the bonded substrate includes a plurality of functional element regions and a scribe region in a plan view,
wherein the singulating includes:
forming a first groove and a second groove in the scribe region; and
cutting the bonded substrate in a region between a first side surface of side surfaces of the first groove that is closest to the second groove and a second side surface of side surfaces of the second groove that is closest to the first groove,
wherein in the forming the first groove and the second groove, the first groove and the second groove each penetrating one of the first substrate and the second substrate, the first interconnection structure layer, the first bonding layer, and the second bonding layer are formed, and wherein each of the first groove and the second groove extends from the one of the first substrate and the second substrate to a position deeper than all interconnection layers provided between the first substrate and the second substrate.

2. The method according to claim 1, wherein the second substrate further includes a second interconnection structure layer provided between the third main surface and the second bonding layer, and wherein each of the first groove and the second groove is formed so as to further penetrate the second interconnection structure layer.

3. The method according to claim 1, wherein the bonded substrate further includes a third substrate disposed between the first substrate and the second substrate, having a fifth main surface and a sixth main surface, provided with a third interconnection structure layer and a third bonding layer on a side of the fifth main surface in this order, and provided with a fourth bonding layer on a side of the sixth main surface, and wherein each of the first groove and the second groove is formed so as to further penetrate the third substrate, the third bonding layer, and the fourth bonding layer.

4. The method according to claim 1, wherein in the singulating, the bonded substrate is cut in a region between the first groove surrounding one functional element region and the second groove surrounding another functional element region adjacent to the one functional element region.

5. The method according to claim 1, wherein in the singulating, the bonded substrate is cut in a region partially overlapping the first groove or the second.

6. The method according to claim 1, wherein each of the first groove and the second groove is provided so as to reach the second substrate from a side of the second main surface of the first substrate.

7. The method semiconductor device according to claim 6, wherein the bonded substrate further includes an opening provided so as to reach a pad electrode provided in the first interconnection structure layer from the side of the second main surface of the first substrate.

8. The method according to claim 6, wherein the second substrate further includes a second interconnection structure layer provided between the third main surface and the second bonding layer, and wherein the bonded substrate further includes an opening provided so as to reach a pad electrode provided in the second interconnection structure layer from the side of the second main surface of the first substrate.

9. The method semiconductor device according to claim 6, wherein the bonded substrate further includes a guard ring region between the scribe region and each of the plurality of functional element regions in the plan view, and wherein the second substrate further includes an insulating structure provided in the guard ring region so as to surround each of the plurality of functional element regions.

10. The method semiconductor device according to claim 1, wherein each of the first groove and the second groove is provided so as to reach the first substrate from a side of the fourth main surface of the second substrate, and wherein the bonded substrate further includes an opening provided so as to reach a pad electrode provided in the first interconnection structure layer from the side of the fourth main surface of the second substrate.

11. The method according to claim 1, wherein each of the first groove and the second groove is provided so as to reach the first substrate from a side of the fourth main surface of the second substrate, wherein the second substrate further includes a second interconnection structure layer provided between the third main surface and the second bonding layer, and wherein the bonded substrate further includes an opening provided so as to reach a pad electrode provided in the second interconnection structure layer from the side of the fourth main surface of the second substrate.

12. The method according to claim 1, wherein each of the first groove and the second groove is provided so as to reach the first substrate from a side of the fourth main surface of the second substrate, and wherein the bonded substrate further includes an optical structure layer provided in a region other than the scribe region on a side of the second main surface of the first substrate.

13. The method according to claim 1, wherein the bonded substrate further includes an optical structure layer provided on a side of the second main surface of the first substrate, and wherein an end portion of the optical structure layer is located inside the scribe region.

14. The method semiconductor device according to claim 1, wherein each of the first groove and the second groove is provided so as to reach the first substrate from a side of the fourth main surface of the second substrate, wherein the bonded substrate further includes a support substrate provided on a side of the second main surface of the first substrate via an adhesive layer, and wherein each of the first groove and the second groove further penetrates the first substrate and reaches the adhesive layer.

15. The method according to claim 14, wherein the bonded substrate further includes an optical structure layer provided between the first substrate and the adhesive layer, and wherein each of the first groove and the second groove penetrates the optical structure layer.

16. The method according to claim 1, wherein each of the first groove and the second groove is provided so as to reach the first substrate from a side of the fourth main surface of the second substrate, wherein the bonded substrate further includes a guard ring region between the scribe region and each of the plurality of functional element regions in the plan view, and wherein the first substrate further includes an insulating structure provided in the guard ring region so as to surround each of the plurality of functional element regions.

17. A method semiconductor device comprising:

singulating a bonded substrate formed by bonding a first substrate having a first main surface and a second main surface and provided with a first interconnection structure layer and a first bonding layer on a side of the first main surface in this order and a second substrate having a third main surface and a fourth main surface and provided with a second bonding layer on a side of the third main surface so that the first bonding layer and the second bonding layer face each other into a plurality of semiconductor devices, wherein the bonded substrate includes a plurality of functional element regions and a scribe region in a plan view, and first and second grooves, each formed in the scribe region so as to penetrate completely one of the first substrate and the second substrate, the first interconnection structure layer, the first bonding layer, and the second bonding layer, and wherein in the singulating, the bonded substrate is cut in a region between a first side surface of side surfaces of the first groove that is closest to the second groove and a second side surface of side surfaces of the second groove that is closest to the first groove.

18. The method according to claim 17, wherein the second substrate further includes a second interconnection structure layer provided between the third main surface and the second bonding layer, and wherein each of the first groove and the second groove is formed so as to further penetrate the second interconnection structure layer.

19. The method according to claim 17, wherein the bonded substrate further includes a third substrate disposed between the first substrate and the second substrate, having a fifth main surface and a sixth main surface, provided with a third interconnection structure layer and a third bonding layer on a side of the fifth main surface in this order, and provided with a fourth bonding layer on a side of the sixth main surface, and wherein each of the first groove and the second groove is formed so as to further penetrate the third substrate, the third bonding layer, and the fourth bonding layer.

20. The method according to claim 17, wherein in the singulating, the bonded substrate is cut in a region between the first groove surrounding one functional element region and the second groove surrounding another functional element region adjacent to the one functional element region.

21. The method according to claim 17, in the singulating, the bonded substrate is cut in a region partially overlapping the first groove or the second groove.

22. The method according to claim 17, wherein each of the first groove and the second groove is provided so as to reach the second substrate from a side of the second main surface of the first substrate.

23. The method semiconductor device according to claim 17, wherein each of the first groove and the second groove is provided so as to reach the first substrate from a side of the fourth main surface of the second substrate.

24. The method according to claim 23, wherein the bonded substrate further includes an opening provided so as to reach a pad electrode provided in the first interconnection structure layer from the side of the fourth main surface of the second substrate.

25. The method semiconductor device according to claim 23, wherein the second substrate further includes a second interconnection structure layer provided between the third main surface and the second bonding layer, and wherein the bonded substrate further includes an opening provided so as to reach a pad electrode provided in the second interconnection structure layer from the side of the fourth main surface of the second substrate.

26. The method semiconductor device according to claim 23, wherein the bonded substrate further includes an optical structure layer provided in a region other than the scribe region on a side of the second main surface of the first substrate.

27. The method semiconductor device according to claim 23, wherein the bonded substrate further includes an optical structure layer provided on a side of the second main surface of the first substrate, and wherein an end portion of the optical structure layer is located inside the scribe region.

28. The method semiconductor device according to claim 23, wherein the bonded substrate further includes a support substrate provided on a side of the second main surface of the first substrate via an adhesive layer, and wherein the groove further penetrates the first substrate and reaches the adhesive layer.

29. The method according to claim 28, wherein the bonded substrate further includes an optical structure layer provided between the first substrate and the adhesive layer, and wherein the groove penetrates the optical structure layer.

30. A method semiconductor device comprising:
singulating a substrate including a first semiconductor layer having a first main surface and a second main surface, a second semiconductor layer having a third main surface opposed to the first main surface of the first semiconductor layer and a fourth main surface, a first bonding layer provided between the first semiconductor layer and the second semiconductor layer, an interconnection structure layer provided between the first semiconductor layer and the first bonding layer, and a second bonding layer provided between the second semiconductor layer and the first bonding layer into a plurality of semiconductor devices, wherein the substrate includes a plurality of functional element regions and a scribe region separating the plurality of functional element regions in a plan view, wherein the singulating includes:
forming a groove that surrounds each of the plurality of functional element regions in the scribe region, and
cutting the substrate in a region between a first side surface of a first groove surrounding one functional element region and a second side surface of a second groove surrounding another functional element region adjacent to the one functional element region, wherein the first side surface is a side surface of side surfaces of the first groove closest to the second groove, and the second side surface is a side surface of side surfaces of the second groove closest to the first groove, and wherein in forming the groove, the groove completely penetrating one of the first semiconductor layer and the second semiconductor layer, the interconnection structure layer, the first bonding layer, and the second bonding layer is formed.

* * * * *